US012705467B2

(12) United States Patent
Lee et al.

(10) Patent No.: US 12,705,467 B2
(45) Date of Patent: Aug. 11, 2026

(54) NEURAL NETWORK DEVICE INCLUDING CONVOLUTION SRAM AND DIAGONAL ACCUMULATION SRAM

(71) Applicant: Samsung Electronics Co., Ltd., Suwon-si (KR)

(72) Inventors: Suk Han Lee, Seoul (KR); Joo-Young Kim, Daejeon (KR); Kyo Min Sohn, Yongin-si (KR); Ji Hoon Kim, Daejeon (KR); Jae Hoon Heo, Daejeon (KR)

(73) Assignees: SAMSUNG ELECTRONICS CO., LTD.; KOREA ADVANCED INSTITUTE OF SCIENCE AND TECHNOLOGY, Daehak-ro (KR)

( * ) Notice: Subject to any disclaimer, the term of this patent is extended or adjusted under 35 U.S.C. 154(b) by 1050 days.

(21) Appl. No.: 17/459,921

(22) Filed: Aug. 27, 2021

(65) Prior Publication Data

US 2022/0207334 A1 Jun. 30, 2022

(30) Foreign Application Priority Data

Dec. 31, 2020 (KR) ........................ 10-2020-0189900

(51) Int. Cl.

| | |
|---|---|
| ***G06N 3/063*** | (2023.01) |
| ***G06F 17/15*** | (2006.01) |
| ***G11C 11/54*** | (2006.01) |

(52) U.S. Cl.
CPC ........... *G06N 3/063* (2013.01); *G06F 17/153* (2013.01); *G11C 11/54* (2013.01)

(58) Field of Classification Search
CPC .................................................... G06F 17/153
See application file for complete search history.

(56) References Cited

U.S. PATENT DOCUMENTS 4,584,671 A * 4/1986 Monk .................... H10B 10/15 365/51
5,391,938 A * 2/1995 Hatsuda .............. G06F 12/0895 327/63

(Continued)

FOREIGN PATENT DOCUMENTS

JP 2010134697 A 6/2010
KR 1020190066473 A 6/2019

(Continued)

OTHER PUBLICATIONS

J.-H. Kim, J. Lee, J. Lee, H.-J. Yoo and J.-Y. Kim, "Z-PIM: An Energy-Efficient Sparsity Aware Processing-In-Memory Architecture with Fully-Variable Weight Precision," 2020 IEEE Symposium on VLSI Circuits, Honolulu, HI, USA, Aug. 10, 2020, pp. 1-2, doi: 10.1109/VLSICircuits18222.2020.9163015. (Year: 2020).*

(Continued)

*Primary Examiner* — James Trujillo
*Assistant Examiner* — Markus Anthony Villanueva
(74) *Attorney, Agent, or Firm* — Muir Patent Law, PLLC

(57) ABSTRACT

A neural network device including a convolution static random access memory (SRAM) configured to output a first operation value and a second operation value 1. An accumulation peripheral operator configured to perform an accumulation peripheral operation on the first and the second operation values, a multiplexer array configured to select and output an output value according to a selection signal, a diagonal accumulation SRAM configured to perform a bitwise accumulation of variable weight values and a spatial-wise accumulation operation on an input, a diagonal movement logic, and an addition array operator configured to perform an addition operation of output values of the diagonal movement logic subsequent to a shift operation, the multiplexer array selects any one of an output value of the accumulation peripheral operator and an output value of the (Continued)

addition array operator according to the selection signal and outputs the selected output value to the diagonal accumulation SRAM.

20 Claims, 27 Drawing Sheets

(56) References Cited

U.S. PATENT DOCUMENTS

| | | | | |
|---|---|---|---|---|
| 6,433,822 | B1 * | 8/2002 | Clark | H04N 3/155 348/E3.018 |
| 10,381,071 | B1 | 8/2019 | Si et al. | |
| 10,699,778 | B2 | 6/2020 | Yu et al. | |
| 10,777,259 | B1 | 9/2020 | Wang et al. | |
| 11,501,145 | B1 * | 11/2022 | Huynh | G06N 3/02 |
| 11,604,973 | B1 * | 3/2023 | Sather | G06F 17/16 |
| 2018/0174642 | A1 * | 6/2018 | Huynh Bao | H10D 62/121 |
| 2019/0042199 | A1 * | 2/2019 | Sumbul | G11C 8/10 |
| 2019/0042949 | A1 * | 2/2019 | Young | G06N 3/10 |
| 2019/0043560 | A1 * | 2/2019 | Sumbul | G11C 11/419 |
| 2019/0056885 | A1 | 2/2019 | Mathuriya et al. | |
| 2019/0057300 | A1 | 2/2019 | Mathuriya et al. | |
| 2019/0057304 | A1 | 2/2019 | Mathuriya et al. | |
| 2019/0087719 | A1 | 3/2019 | Seo et al. | |
| 2019/0205095 | A1 | 7/2019 | Gupta et al. | |
| 2019/0370640 | A1 | 12/2019 | Peng et al. | |
| 2020/0151556 | A1 | 5/2020 | Chen et al. | |
| 2020/0174786 | A1 | 6/2020 | Zhang et al. | |
| 2020/0195828 | A1 * | 6/2020 | Reyserhove | H04N 25/533 |
| 2020/0202922 | A1 * | 6/2020 | Chi | G11C 7/18 |
| 2020/0365223 | A1 * | 11/2020 | Lu | G11C 29/024 |
| 2021/0034567 | A1 * | 2/2021 | Bringivijayaraghavan | G06F 3/0673 |
| 2021/0295906 | A1 * | 9/2021 | Chi | G11C 11/419 |

FOREIGN PATENT DOCUMENTS

| | | | | |
|---|---|---|---|---|
| KR | 1020200110165 A | | 9/2020 | |
| KR | 1020200143686 A | | 12/2020 | |
| WO | WO-2020139895 A1 | * | 7/2020 | G06F 7/501 |

OTHER PUBLICATIONS

Anonymous, "Shift Register or multiplexer for sensor array?", Apr. 14, 2018. Arduino Forum. Project Guidance. (Year: 2018).*

Patterson, David A., and John L. Hennessy. Computer Organization and Design: The Hardware/Software Interface, 5th ed. 2014 Elsevier Inc. Ch. 4, Sec. 4.6, p. 300-316. (Year: 2014).*

A. Biswas and A. P. Chandrakasan, "CONV-SRAM: An Energy-Efficient SRAM With In-Memory Dot-Product Computation for Low-Power Convolutional Neural Networks," in IEEE Journal of Solid-State Circuits, vol. 54, No. 1, pp. 217-230, Jan. 2019, doi: 10.1109/JSSC.2018.2880918. (Year: 2019).*

Horowitz, Paul, et al., The Art of Electronics. 3rd ed., Cambridge University Press, 2015. (Year: 2015).*

* cited by examiner

FIG. 18

| In[n] | W[n] | LBL |
| --- | --- | --- |
| 0 | 0 | 0 |
| 0 | 1 | |
| 1 | 0 | |
| 1 | 1 | 1 |

NEURAL NETWORK DEVICE INCLUDING CONVOLUTION SRAM AND DIAGONAL ACCUMULATION SRAM

This application claims priority to Korean Patent Application No. 10-2020-0189900 filed on Dec. 31, 2020 in the Korean Intellectual Property Office, the disclosure of which is incorporated herein by reference in its entirety.

This application was supported in part by the MSIT (Ministry of Science and ICT), Korea, under the ITRC (Information Technology Research Center) support program (IITP-2020-0-01847) supervised by the IITP (Institute for Information & Communications Technology Planning & Evaluation), and Samsung Electronics Co., Ltd.

BACKGROUND

1. Field

The present disclosure relates to a neural network device including a convolution static random access memory (SRAM) and a diagonal accumulation SRAM.

2. Description of the Related Art

Artificial neural networks may be designed and trained to perform various functions, and their application technologies include image processing, speech recognition, inference/prediction, knowledge expression, motion control, and the like. For example, deep neural network models may include a large number of layers and parameters (weights).

These deep neural network models typically tend to exhibit better performance as large models with which large numbers of layers are used with a large amount of training data from big databases. Accordingly, these deep neural network models are highly computation-intensive and utilize a large amount of storage.

Therefore, when these deep neural network models are applied to device products with limited computational resources and memory, such as smartphones, robots, home appliances, or Internet of Things (IoT) devices, in an on-device form, the deep neural network models need to be compressed and installed in consideration of the limitations of device resources in order to minimize memory usage, computational complexity, power consumption, and the like.

SUMMARY

Aspects of the present disclosure provide a convolution static random access memory (SRAM) with an improved operation processing speed.

Aspects of the present disclosure also provide a neural network device with an improved operation processing speed.

It should be noted that aspects of the present disclosure are not limited to the above-described aspects, and other aspects of the present disclosure will be apparent to those skilled in the art from the following descriptions.

Specific details of other aspects of the present disclosure are included in the detailed description and drawings.

According to an aspect of the present disclosure, there is provided a neural network device comprising a convolution static random access memory (SRAM) configured to output a first operation value by performing an accumulation peripheral operation on a first input value channel and a first weight channel and output a second operation value by performing the accumulation peripheral operation on a second input value channel following the first input value channel and a second weight channel following the first weight channel, an accumulation peripheral operator connected to the convolution SRAM, and configured to receive the first operation value and the second operation value of the convolution SRAM to perform the accumulation peripheral operation on the first operation value and the second operation value, a multiplexer array configured to select and output an output value according to a selection signal, a diagonal accumulation SRAM configured to perform a bit-wise accumulation of variable weight values and a spatial-wise accumulation operation on an input, a diagonal movement logic configured to receive the output of the diagonal accumulation SRAM and perform a shift operation according to a shift signal, and an addition array operator configured to perform an addition operation of the output values of the diagonal movement logic subsequent to the shift operation, wherein the multiplexer array selects any one of an output value of the accumulation peripheral operator and an output value of the addition array operator according to the selection signal and outputs the selected output value to the diagonal accumulation SRAM.

According to an aspect of the present disclosure, there is provided a convolution static random access memory (SRAM) comprising, a pre-charging unit, n (n is a natural number) 8T SRAM cells, and an enable signal input, wherein the pre-charging unit charges weight values in a channel direction, and an input value stored in at least one of the 8T SRAM cells and a weight value charged in the pre-charging unit are subjected to an AND operation within the at least one of the 8T SRAM cell.

According to an aspect of the present disclosure, there is provided a neural network device comprising, a diagonal accumulation static random access memory (SRAM), and a diagonal movement logic, wherein the diagonal accumulation SRAM includes a first transistor, a second transistor, a third transistor, and a fourth transistor and first and second inverters, a gate terminal of the first transistor is connected to a read word line, a gate terminal of the second transistor is connected to any one of the first and second inverters, gate terminals of the third and fourth transistors are connected to a write word line, the first and second inverters store a first input value by applying a voltage to the write word line, and the first and second transistors perform an AND operation on a second input value and the first input value supplied through a read bit line by applying a voltage to the read word line.

BRIEF DESCRIPTION OF THE DRAWINGS

The above and other aspects and features of the present disclosure will become more apparent by describing in detail exemplary embodiments thereof with reference to the attached drawings, in which:

FIG. 18 is a diagram illustrating an AND operation value of FIG. 17;

DETAILED DESCRIPTION OF THE EMBODIMENTS

Hereinafter, embodiments according to aspects of the present disclosure will be described with reference to the accompanying drawings.

Figure 1:
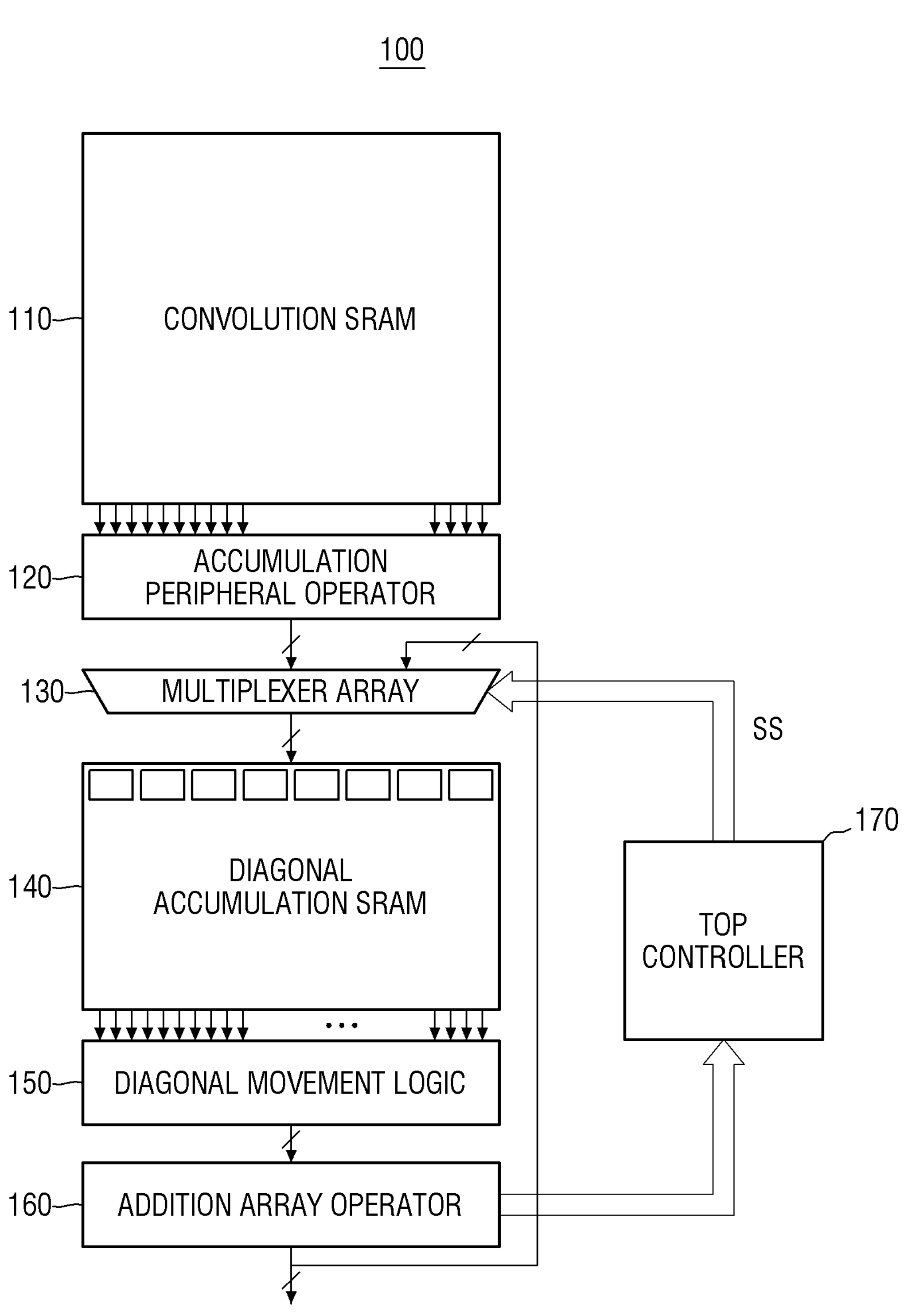
FIG. 1 is a block diagram of a neural network device according to some embodiments.
Figure 2:
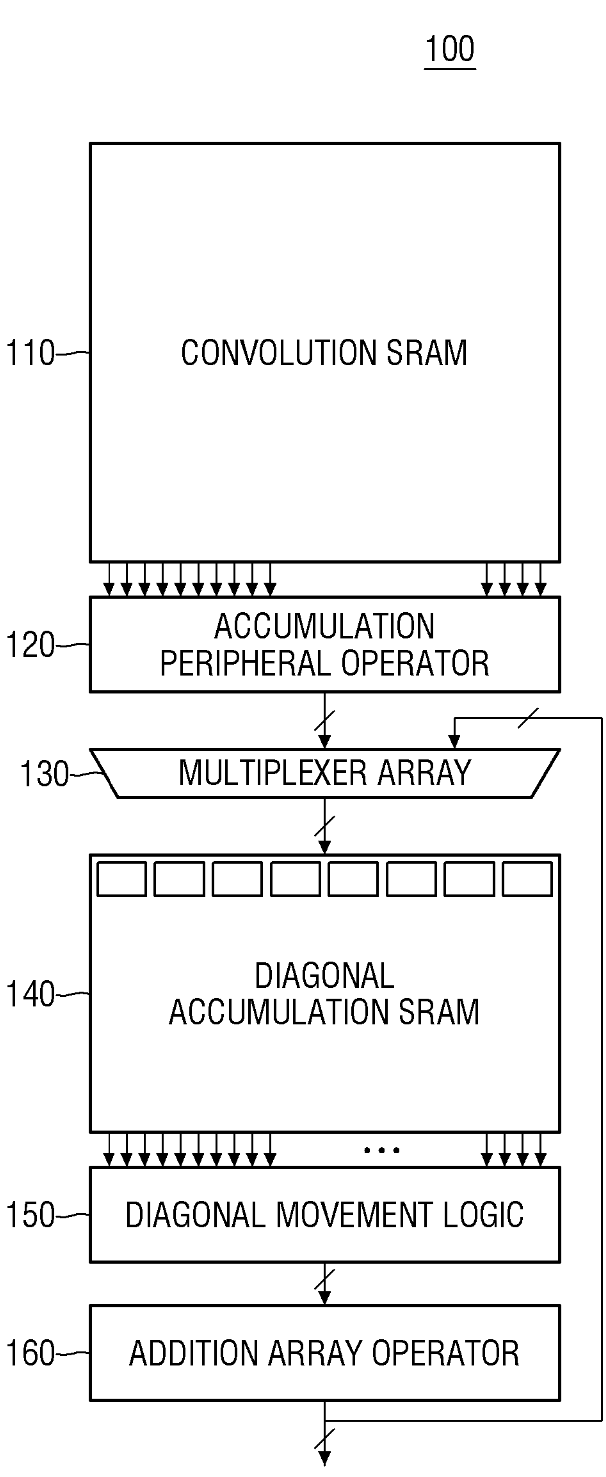
FIG. 2 is a block diagram of a channel-wise accumulation operation and a bit direction accumulation operation of FIG. 1.
Figure 3:
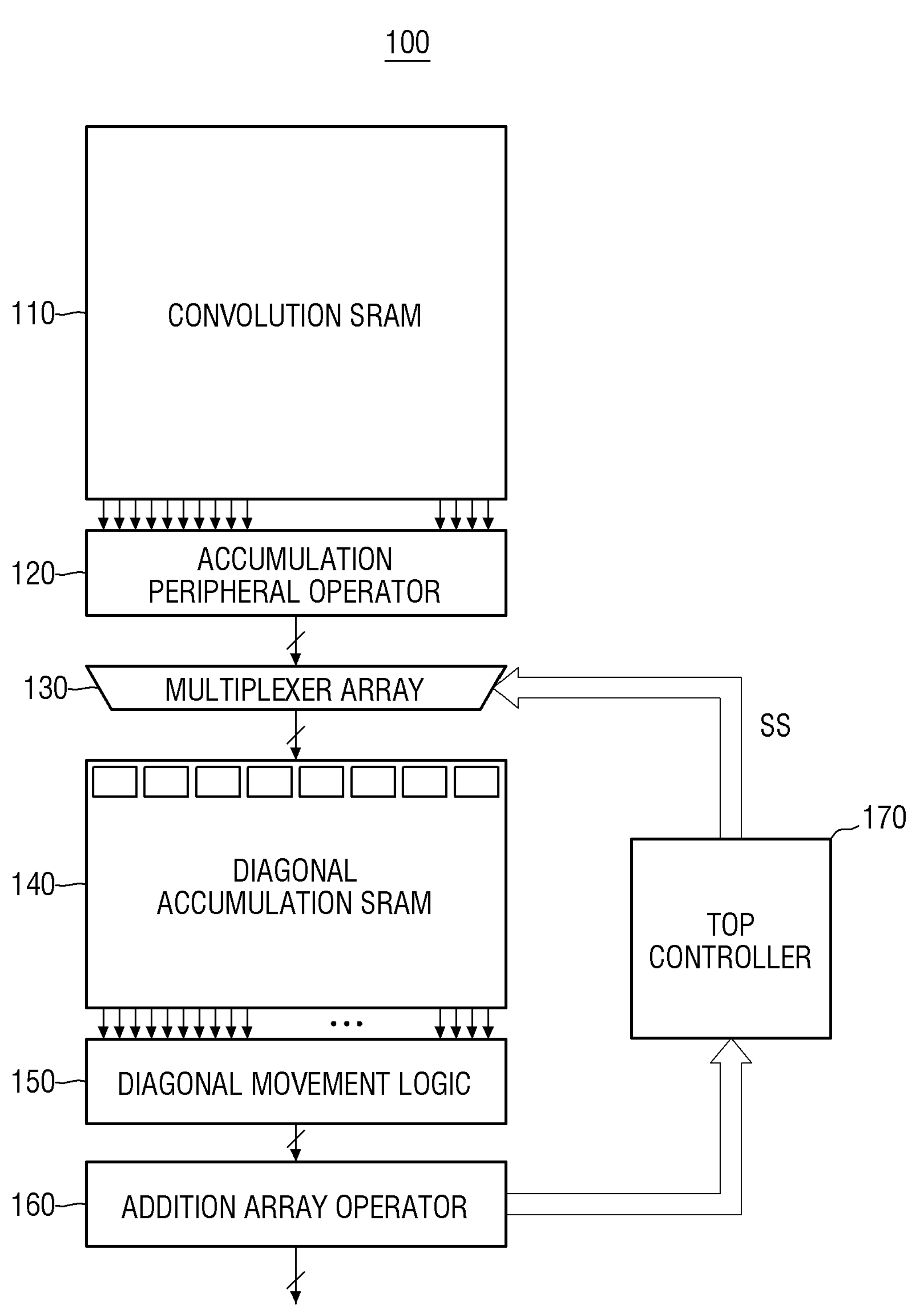
FIG. 3 is a block diagram of the channel-wise accumulation operation and a spatial-wise accumulation operation of FIG. 1.
Figure 4:
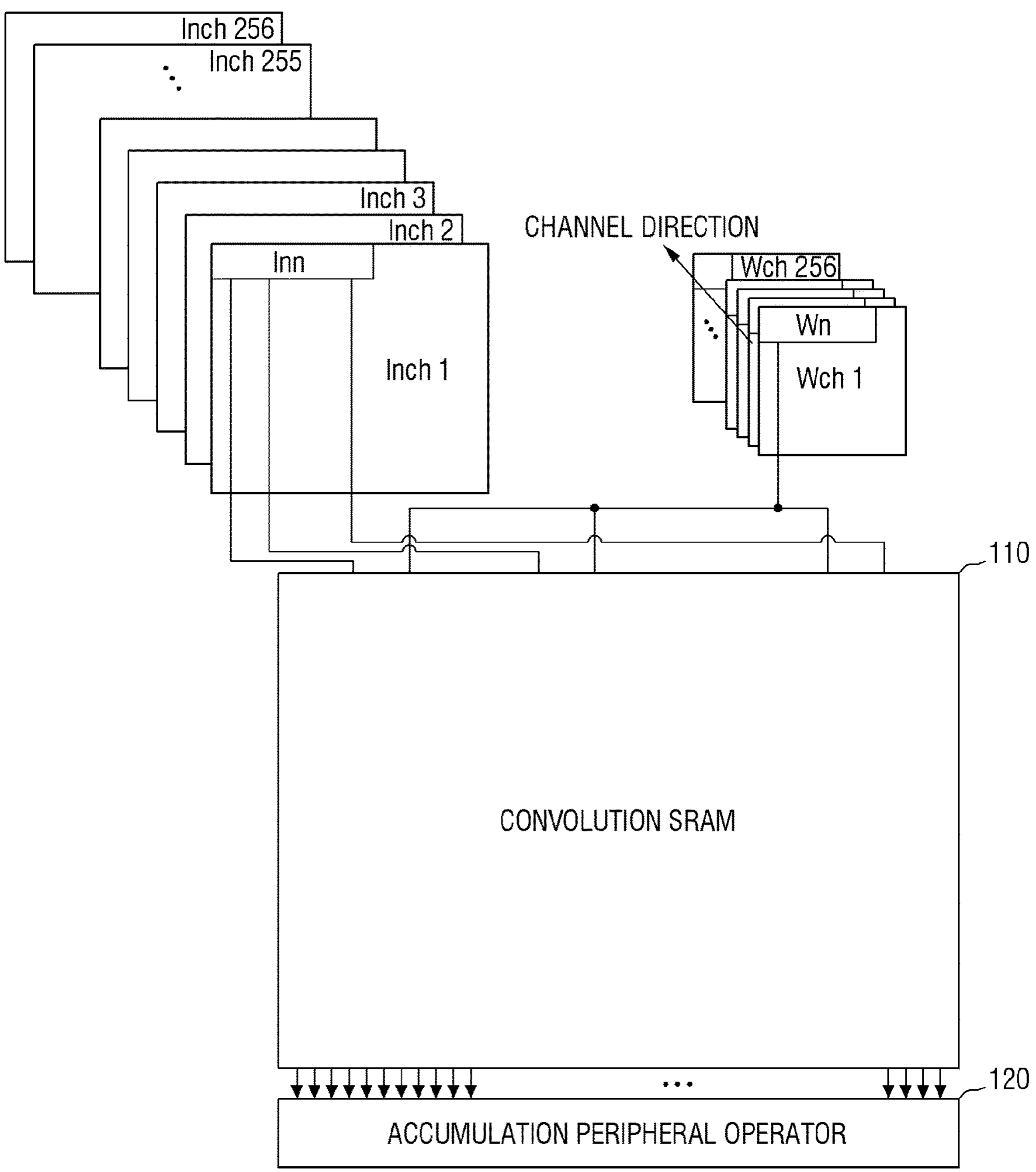
FIG. 4 is a diagram illustrating an input value channel and a weight channel in a convolution static random access memory (SRAM) of FIG. 1.
Figure 5:
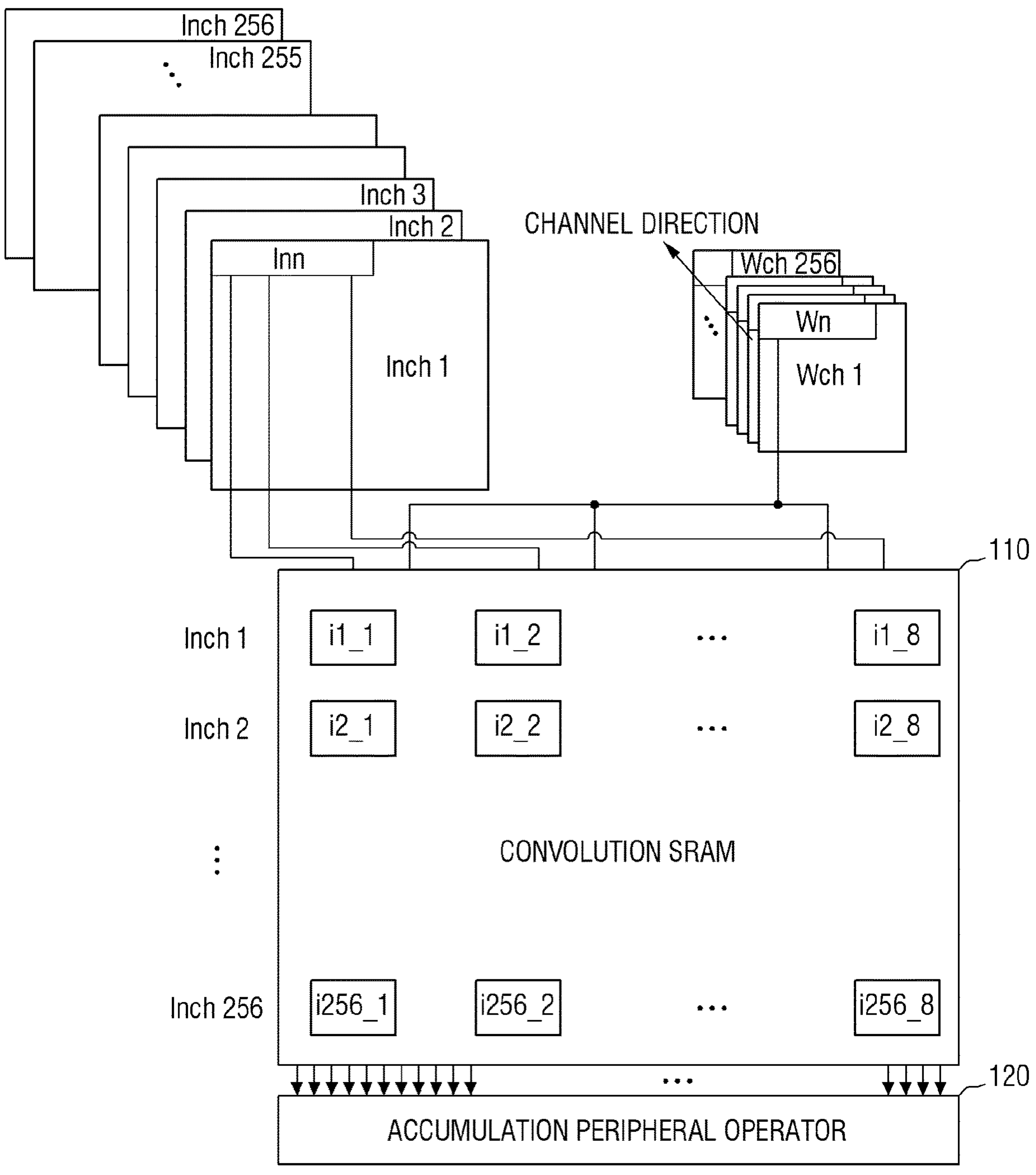
FIG. 5 is a diagram illustrating loading of values of the input value channel and the weight channel of FIG. 4.
Figure 6:
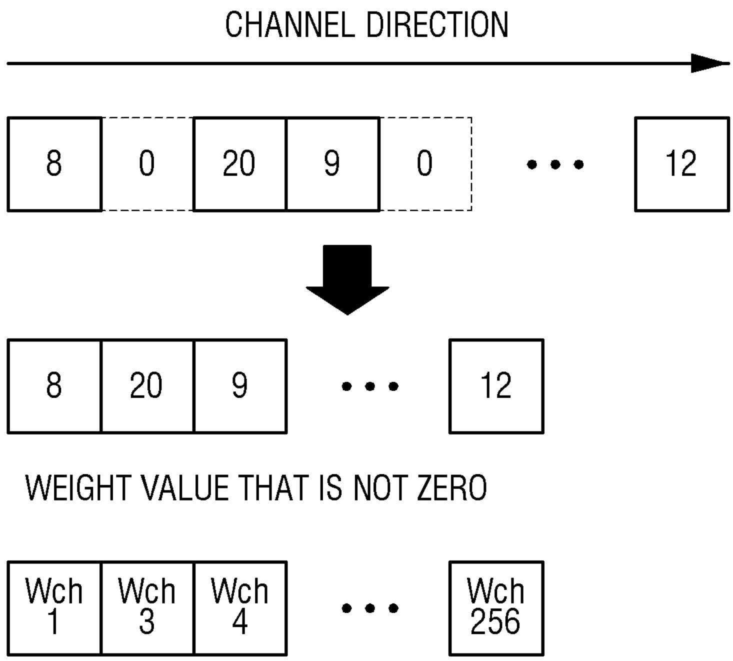
FIG. 6 is a diagram illustrating the weight channel of FIG. 4.

FIG. 1 is a block diagram of a neural network device according to example embodiments. FIG. 2 is a block diagram of a channel-wise accumulation operation and a bit direction accumulation operation of FIG. 1. FIG. 3 is a block diagram of the channel-wise accumulation operation and a spatial-wise accumulation operation of FIG. 1. FIG. 4 is a diagram illustrating an input value channel and a weight channel in a convolution static random access memory (SRAM) of FIG. 1. FIG. 5 is a diagram illustrating loading of values of the input value channel and the weight channel of FIG. 4. FIG. 6 is a diagram illustrating the weight channel of FIG. 4.

Referring to FIG. 1, a neural network device 100 may include a convolution SRAM 110, an accumulation peripheral operator 120, a multiplexer array 130, a diagonal accumulation SRAM 140, a diagonal movement logic 150, and an addition array operator 160.

The convolution SRAM 110 may perform an AND operation in a channel direction.

Referring to FIGS. 1 to 4, the convolution SRAM 110 may store input value channels Inch 1 to Inch n (n is a natural number greater than one). The n input values Inn may be stored in each of the input value channels Inch 1 to Inch n. The convolution SRAM 110 may load weight values Wn of weight channels Wch 1 to Wch n (n is a natural number) corresponding to the input value channels Inch 1 to Inch n into the input value channels Inch 1 to Inch n. For example, the weight value Wn of the first weight channel Wch 1 may correspond to the first input value channel Inch 1, and the weight value Wn of the second weight channel Wch 2 may correspond to the second input value channel Inch 2. Here, the weight value Wn may mean a value obtained by loading the values of the weight channels Wch 1 to Wch n in units of bits every cycle.

The convolution SRAM 110 may perform an accumulation peripheral operation on the first input value channel Inch 1 and the first weight channel Wch 1. Thereafter, an AND operation may be sequentially performed on the second input value channel Inch 2 and the second weight channel Wch 2. Here, the second input value channel Inch 2 may be an input value channel following the first input value channel Inch 1. The second weight channel Wch 2 may be a weight channel following the first weight channel Wch 1. After the AND operation is performed on the second input value channel Inch 2 and the second weight channel Wch 2, an AND operation may be further performed on the third input value channel Inch 3 and the third weight channel Wch 3 following the second input value channel Inch 2 and the second weight channel Wch 2. Referring to FIG. 6, the weight values Wn of the weight channels Wch 1 to Wch n in the channel direction may be input to the input value channels Inch 1 to Inch n.

For example, when n is 256, the number of weight channels Wch 1 to Wch n may be 256. In the exemplary embodiment illustrated in FIG. 6, the weight value Wn of the first weight channel Wch 1 may be 8, the weight value Wn of the second weight channel Wch 2 may be 0, the weight value Wn of the third weight channel Wch 3 may be 20, the weight value Wn of the fourth weight channel Wch 4 may be 9, the weight value Wn of the fifth weight channel Wch 5 may be 0, and the weight value Wn of the $256^{th}$ weight channel Wch 256 may be 12.

Here, the weight values Wn of the second weight channel Wch 2 and the fifth weight channel Wch 5 are 0. The second weight channel Wch 2 and the fifth weight channel Wch 5 may not be loaded into the input value channels Inch 1 to Inch n.

For example, the weight channel whose weight value Wn is 0 can be skipped without being loaded into the input value channels Inch 1 to Inch n. By not loading the weight channels Wch 1 to Wch n whose weight values Wn are 0 into the input value channels Inch 1 to Inch n, sparsity processing may be possible. Sparsity processing may reduce computing power, memory, and bandwidth used by a neural network.

The weight values Wn provided from the weight channels Wch 1 to Wch n are input to each of the input value channels Inch 1 to Inch n to perform a channel direction operation.

For example, the convolution SRAM 110 may load the weight value Wn of the first weight channel Wch1 into the first input value channel Inch 1. For example, the convolution SRAM 110 may perform a channel accumulation operation of the first input value channel Inch 1 by loading the weight value Wn.

Referring back to FIGS. 1 to 3, the accumulation peripheral operator 120 may be connected to the convolution SRAM 110. The accumulation peripheral operator 120 may receive an output value of the convolution SRAM 110 and perform the accumulation peripheral operation on all input value channels Inch 1 to Inch n that include the first input value channel Inch 1.

For example, when the number of input value channels Inch 1 to Inch n is 256, the convolution SRAM 110 may sequentially perform an AND operation on 256 channels, and at the same time, the accumulation peripheral operator 120 may receive the output value of the convolution SRAM 110 to perform the accumulation peripheral operation on all 256 channels.

The accumulation peripheral operator 120 may receive a first operation value and a second operation value of the convolution SRAM 110 to perform the accumulation peripheral operation on the first operation value and the second operation value. Here, the first operation value may be AND operation values of the first input value channel Inch 1 and the first weight channel Wch 1, and the second operation value may be AND operation values of the second input value channel Inch 2 and the second weight channel Wch 2.

The accumulation peripheral operator 120 may further perform the accumulation peripheral operation on the first operation value and a third operation value. Here, the third operation value may be AND operation values of the third input value channel Inch 3 and the third weight channel Wch 3.

The accumulation peripheral operator 120 may further perform the accumulation peripheral operation on the second operation value and the third operation value.

The accumulation peripheral operator 120 may transmit an input value input from the convolution SRAM 110 to the multiplexer array 130.

The multiplexer array 130 may receive an output value of the accumulation peripheral operator 120. The multiplexer array 130 may receive a shift signal SS generated by a top controller 170. The multiplexer array 130 may select an output value according to a selection signal. The multiplexer array 130 may select one of an input value input from the accumulation peripheral operator 120 or an input value input from the addition array operator 160 according to the selection signal and transmit the selected input value to the diagonal accumulation SRAM 140. The accumulation peripheral operator 120, diagonal movement logic 150, addition array operator 160, and top controller 170 may be implanted with various hardware devices, such as an integrated circuit, an application specific IC (ASCI), a field programmable gate array (FPGA), and a complex programmable logic device (CPLD), firmware driven in hardware devices, software such as an application, or a combination of a hardware device and software.

The diagonal accumulation SRAM 140 may receive an output value of the multiplexer array 130. The diagonal accumulation SRAM 140 may store, as an input value input, the output value received from the multiplexer array 130. The diagonal accumulation SRAM 140 may perform a bit direction accumulation or a spatial-wise accumulation operation of the stored value. The diagonal accumulation SRAM 140 may further include shift registers SR1 to SRn (illustrated in FIG. 11) that perform a shift operation on the output value received from the multiplexer array 130.

The diagonal accumulation SRAM 140 may perform a variable weight bit direction accumulation and a spatial-wise accumulation operation on an input.

The diagonal movement logic 150 may receive an output value generated from the diagonal accumulation SRAM 140. The diagonal movement logic 150 may determine whether to shift the output value of the diagonal accumulation SRAM 140 based on the shift signal SS.

The addition array operator 160 may receive the output value of the diagonal movement logic 150. The addition array operator 160 may receive shift-operated output values from the diagonal movement logic 150. The addition array operator 160 may perform an addition operation of the shift-operated output values.

The top controller 170 may receive the output of the addition array operator 160. The top controller 170 may generate the shift signal SS. The top controller 170 may generate the shift signal SS based on the output of the addition array operator 160. The top controller 170 may provide the shift signal to the multiplexer array 130. The top controller 170 may generate and control an overall input/output signal of the neural network device 100.

Figure 7:
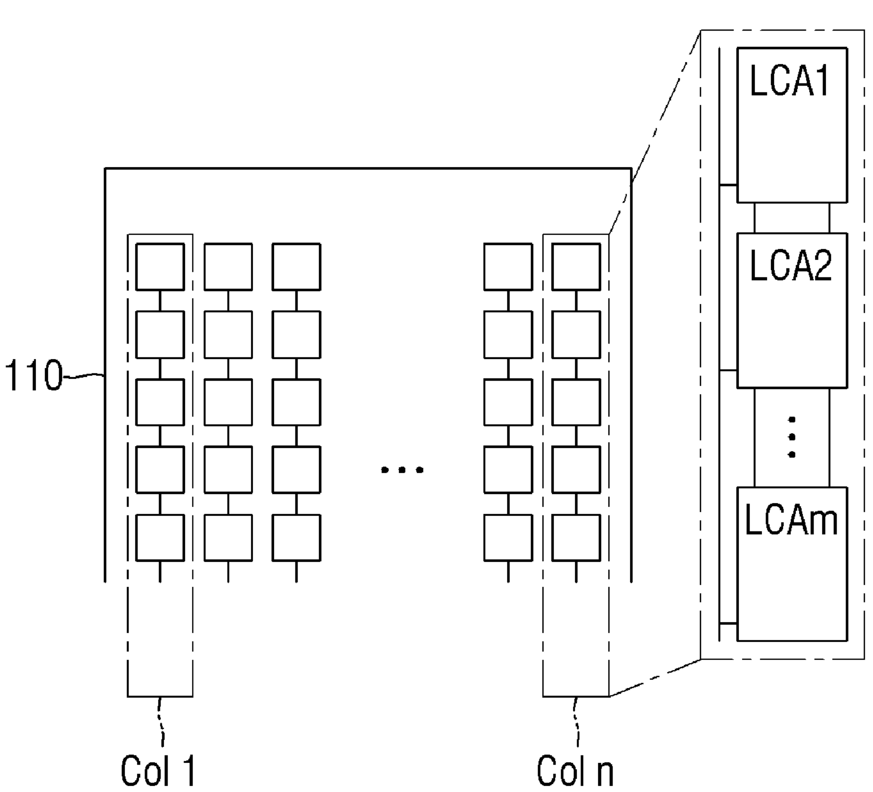
FIG. 7 is a block diagram illustrating a local cell array of the convolution SRAM according to some embodiments.
Figure 8:
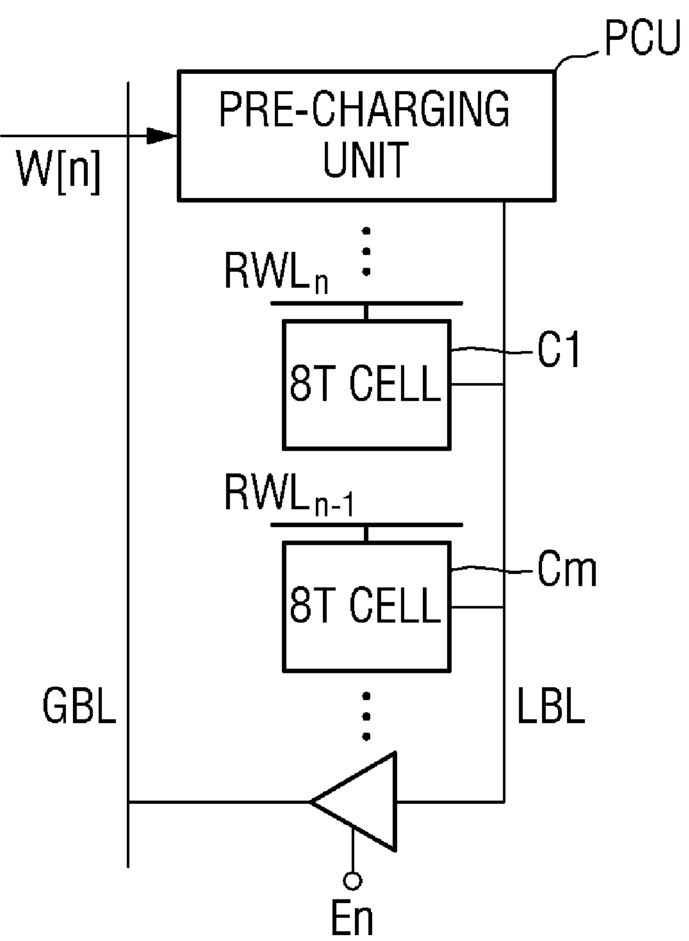
FIG. 8 is a diagram illustrating a structure of the local cell array of FIG. 7.
Figure 9:
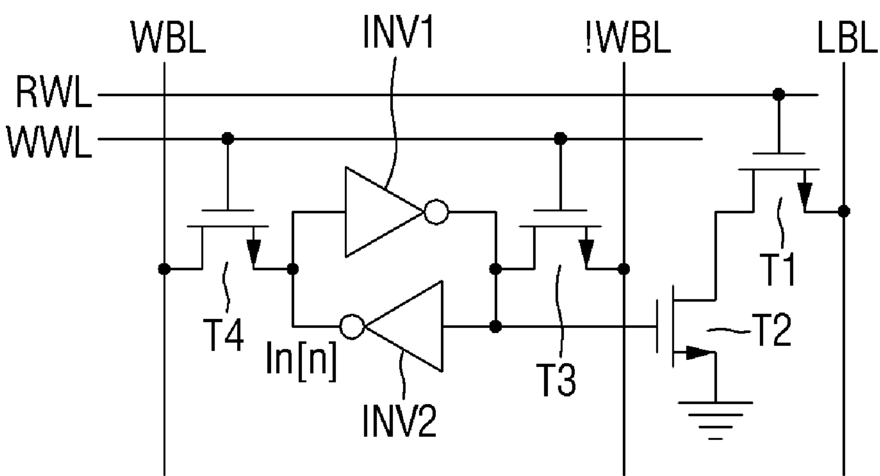
FIG. 9 is a diagram illustrating a structure of an 8T cell array of FIG. 8.

FIG. 7 is a block diagram illustrating a local cell array of the convolution SRAM according to some embodiments. FIG. 8 is a diagram illustrating a structure of the local cell array of FIG. 7. FIG. 9 is a diagram illustrating a structure of an 8T cell array of FIG. 8.

Referring to FIG. 7, the convolution SRAM 110 includes columns Col 1 to Col n. The number of columns may ben (n is a natural number). Each of the columns Col 1 to Col n may include local cell arrays LCA1 to LCAm. The number of local cell arrays LCA1 to LCAm may be m (m is a natural number). In some embodiments, n and m may be different natural numbers.

Referring to FIG. 8, the local cell arrays LCA1 to LCAm may include a pre-charging unit PCU, 8T cells C1 to Cm, and an enable signal input unit En.

The pre-charging unit PCU may be connected to a local bit line LBL. The pre-charging unit PCU may receive the weight value Wn to charge the weight value Wn. The pre-charging unit PCU may charge the weight values Wn from the weight channel Wch 1 to Wch n. The weight value Wn may be stored in the pre-charging unit PCU.

The 8T cells C1 to Cm may be connected to the local bit line LBL. The number of 8T cells C1 to Cm may be m (m is a natural number). When the number of local cell arrays LCA1 to LCAm is m, the number of 8T cells C1 to Cm may also be m. For example, the number of local cell arrays LCA1 to LCAm may be 16, and the number of 8T cells C1 to Cm may also be 16. However, this is only exemplary, and the embodiments may be modified and implemented differently.

Referring to FIG. 9, the 8T cells C1 to Cm may include first to fourth transistors T1 to T4, a first inverter INV1, and a second inverter INV2.

A gate terminal of the first transistor T1 may be connected to a read word line RWL, one terminal (for example, a source terminal) thereof may be connected to the local bit line LBL, and the other terminal (for example, a drain terminal) thereof may be connected to one terminal of the second transistor T2.

One terminal (for example, a source terminal) of the second transistor T2 may be connected to one terminal (for example, a drain terminal) of the first transistor T1, the other terminal (for example, a drain terminal) thereof may be connected to a ground, and the gate terminal thereof may be connected to the second inverter INV2.

A gate terminal of the third transistor T3 may be connected to a write word line WWL, one terminal (for example, a source terminal) thereof may be connected to a word bit line bar !WBL, and the other terminal (for example, a drain terminal) thereof may be connected to an output terminal of the first inverter INV1 and an input terminal of the second inverter INV2.

A gate terminal of the fourth transistor T4 may be connected to the write word line WWL, one terminal (for example, a source terminal) thereof may be connected to an input terminal of the first inverter INV1 and an output terminal of the second inverter INV2, and the other terminal (for example, a drain terminal) thereof may be connected to the write bit line WBL.

The first to fourth transistors T1 to T4 may be, for example, N-channel metal oxide semiconductor (NMOS) transistors, but embodiments are not limited thereto.

The input terminal of the first inverter INV1 may be connected to one terminal of the fourth transistor T4, and the output terminal thereof may be connected to one terminal of the third transistor T3.

The input terminal of the second inverter INV2 may be connected to one terminal of the third transistor T3 and the output terminal thereof may be connected to one terminal of the fourth transistor T4.

An input value Inn may be stored in the 8T cells C1 to Cm. The stored input value Inn may be 0 or 1. The input value Inn may be read by applying a voltage to the read word lines RWL of the 8T cells C1 to Cm. A value of 0 or 1, which is the input value Inn, may be read according to a voltage value applied to the read word line RWL.

Referring back to FIG. 8, the enable signal input unit En may be connected to the local bit line LBL. A signal input to the enable signal input unit En may be an enable or disable signal. The disable signal may have a value different from that of the enable signal. For example, the value of the enable signal may be 1, and the value of the disable signal may be 0.

The enable signal input unit En may output an output value in response to the enable signal. The enable signal input unit En may output an output value to a global bit line GBL in response to the enable signal. The enable signal input unit En may output an output value to the global bit line GBL in response to the disable signal.

Only a first local cell array LCA1 may be turned on in response to the enable signal, and the remaining local cell arrays LCA2 to LCAm may be turned off in response to the disable signal.

For example, when the number of local cell arrays is 16, the first local cell array LCA1 may be turned on in response to the enable signal, and a second local cell array to a sixteenth local cell array LCA2 to LCA16 may be turned off in response to the disable signal. The first local cell array LCA1 may output an output value to the global bit line GBL, and the second local cell array to the sixteenth local cell array LCA2 to LCA16 may not output the output value to the global bit line GBL.

Figure 10:
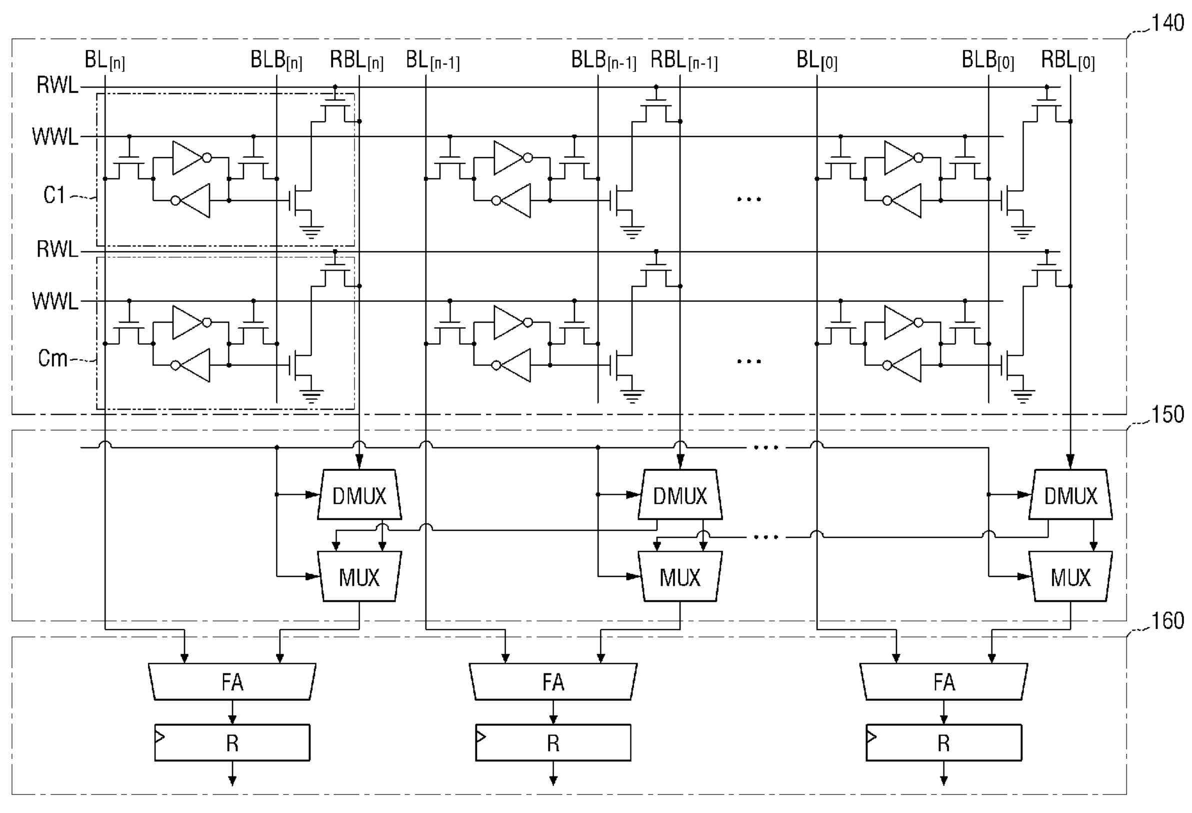
FIG. 10 is a diagram illustrating a diagonal accumulation SRAM, a diagonal movement logic, and an addition array operator according to some embodiments.
Figure 11:
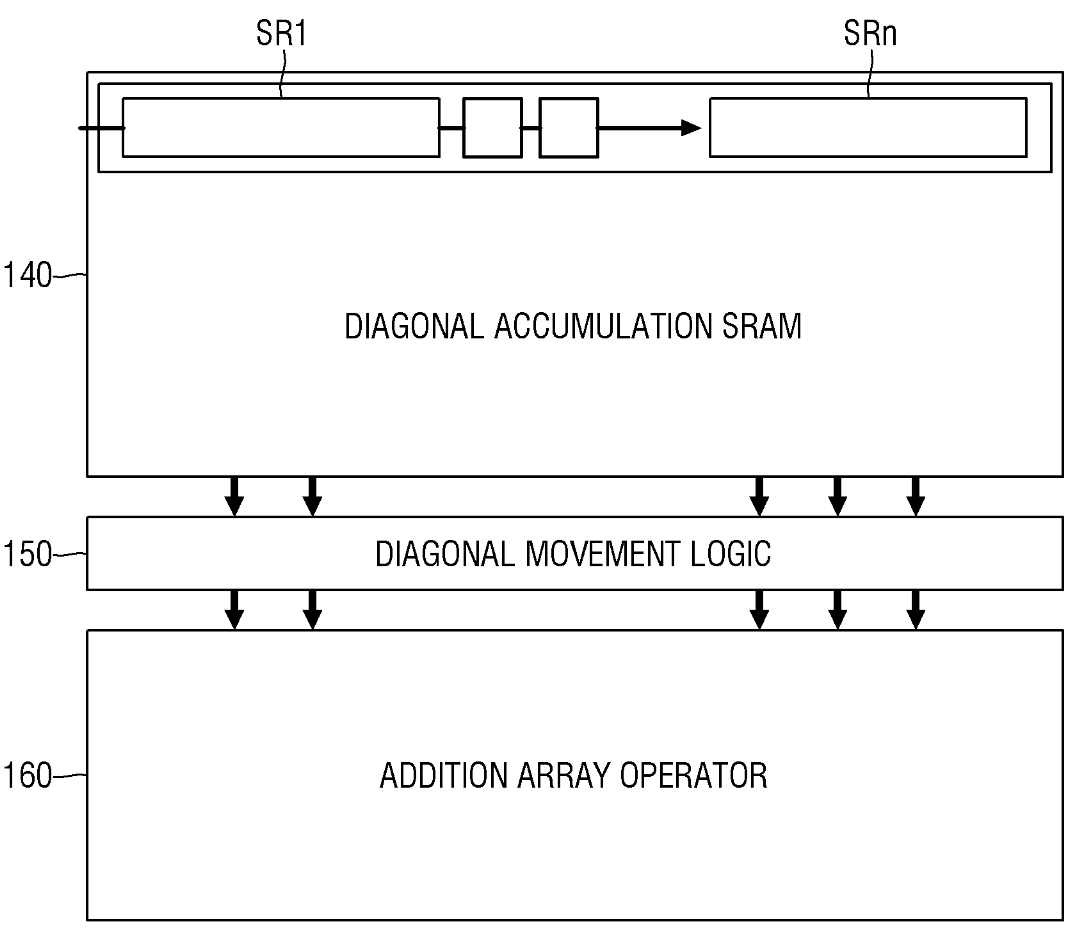
FIG. 11 is a diagram illustrating that a shift register is further included in addition to the components of FIG. 10.
Figure 12:
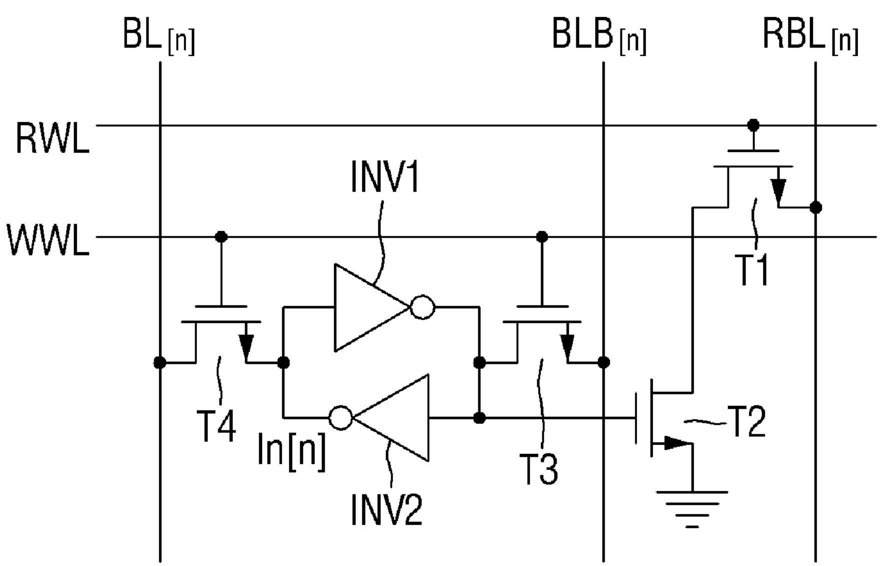
FIG. 12 is a diagram illustrating a structure of the diagonal accumulation SRAM according to some embodiments.

FIG. 10 is a diagram illustrating a diagonal accumulation SRAM, a diagonal movement logic, and an addition array operator according to some embodiments. FIG. 11 is a diagram illustrating that a shift register is further included in addition to the components of FIG. 10. FIG. 12 is a diagram illustrating a structure of the diagonal accumulation SRAM according to some embodiments.

Referring to FIG. 10, the diagonal accumulation SRAM 140 may include 8T cells (e.g., 8-transistor cells) C1 to Cm. The diagonal movement logic 150 may include a demultiplexer DMUX and a multiplexer MUX. The addition array operator 160 may include a full adder FA and a register R.

The demultiplexer DMUX may receive a shift signal and shift an output value of the diagonal accumulation SRAM 140. The demultiplexer DMUX may perform a shift operation by receiving a first shift signal generated by the top controller 170 (illustrated in FIG. 1).

For example, when a weight bit is N bits, N−1 shift operations may be performed. At this time, N−2 shift operations may be performed by shift registers SR1 to SRn in the diagonal accumulation SRAM 140. For example, the shift registers SR1 to SRn may receive the first shift signal and perform the N−2 shift operations.

A second shift signal may be generated by the top controller 170. The second shift signal may be different from the first shift signal. The second shift signal may be a signal that allows the output value of the diagonal accumulation SRAM 140 to be shifted by a single bit. For example, the second shift signal may be shifted by a single bit, and the first shift signal may be shifted by two or more bits.

Referring to FIG. 11, the diagonal accumulation SRAM 140 may further include shift registers SR1 to SRn (n is a natural number). The shift registers SR1 to SRn may perform the shift operation. The shift registers SR1 to SRn may perform the shift operation on the first input value and the second input value. The shift signal SS (illustrated in FIG. 1) may be generated by the top controller 170 (illustrated in FIG. 1).

The 8T cells C1 to Cm of the diagonal accumulation SRAM 140 will be described with reference to FIGS. 10 and 12.

Referring to FIGS. 10 and 12, the 8T cells C1 to Cm may include the first to fourth transistors T1 to T4, the first inverter INV1, and the second inverter INV2.

The gate terminal of the first transistor T1 may be connected to the read word line RWL, one terminal (for example, a source terminal) thereof may be connected to the read bit line RBL, and the other terminal (for example, a drain terminal) thereof may be connected to one terminal of the second transistor T2.

One terminal (for example, a source terminal) of the second transistor T2 may be connected to one terminal (for example, a drain terminal) of the first transistor T1, the other terminal (for example, a drain terminal) thereof may be connected to the ground, and the gate terminal thereof may be connected to the second inverter INV2.

The gate terminal of the third transistor T3 may be connected to the write word line WWL, one terminal (for example, a source terminal) thereof may be connected to a bit line bar BLB, and the other terminal (for example, a drain terminal) thereof may be connected to the output terminal of the first inverter INV1 and the input terminal of the second inverter INV2.

The gate terminal of the fourth transistor T4 may be connected to the write word line WWL, one terminal (for example, a source terminal) thereof may be connected to the input terminal of the first inverter INV1 and the output terminal of the second inverter INV2, and the other terminal (for example, a drain terminal) thereof may be connected to a bit line BL.

The first to fourth transistors T1 to T4 may be, for example, NMOS transistors, but embodiments are not limited thereto.

The input terminal of the first inverter INV1 may be connected to one terminal of the fourth transistor T4, and the output terminal thereof may be connected to one terminal of the third transistor T3.

The input terminal of the second inverter INV2 may be connected to one terminal of the third transistor T3 and the output terminal thereof may be connected to one terminal of the fourth transistor T4.

Figure 13:
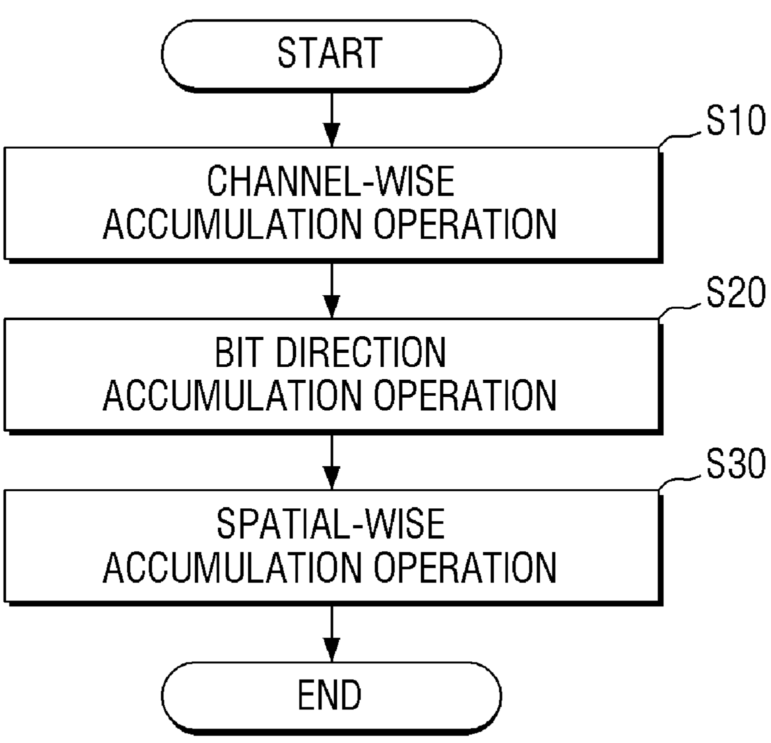
FIG. 13 is a flowchart illustrating a method of operating a neural network device according to some embodiments.

The first inverter INV1 and the second inverter INV2 may store input values when a voltage is applied to the write word line WWL. FIG. 13 is a flowchart illustrating a method of operating a neural network device according to some embodiments.

Referring to FIG. 13, the channel-wise accumulation operation is performed (S10).

For example, referring to FIGS. 1 to 6, the convolution SRAM 110 may perform an AND operation on the received weight values Wn and the input value Inn.

When the number of weight channels Wch 1 to Wch n is N and the number of input value channels Inch 1 to Inch n is N, the convolution SRAM 110 may perform the AND operation on the first weight channel Wch 1 and the first input value channel Inch 1. For example, the convolution SRAM 110 may sequentially perform the AND operation on each input value channel Inch 1 to Inch n and the weight channels Wch 1 to Wch n corresponding thereto. By receiving the output value of the convolution SRAM 110, the accumulation peripheral operator 120 may perform the channel-wise accumulation operation.

Next, the bit direction accumulation operation is performed (S20).

For example, referring to FIGS. 1 to 3, the diagonal accumulation SRAM 140 may perform the bit direction accumulation operation on the input value provided from the multiplexer array 130. The diagonal accumulation SRAM 140 may perform the shift operation by receiving the shift signal generated by the top controller 170, thereby performing the bit direction accumulation operation.

Finally, the spatial-wise accumulation operation is performed (S30).

For example, referring to FIGS. 1 to 3, the top controller 170 may generate the shift signal. The shift signal generated by the top controller 170 may be provided to the multiplexer array 130. The diagonal accumulation SRAM 140 may receive the output value of the multiplexer array 130. The diagonal accumulation SRAM 140 may perform the spatial-wise accumulation operation.

Figure 14:
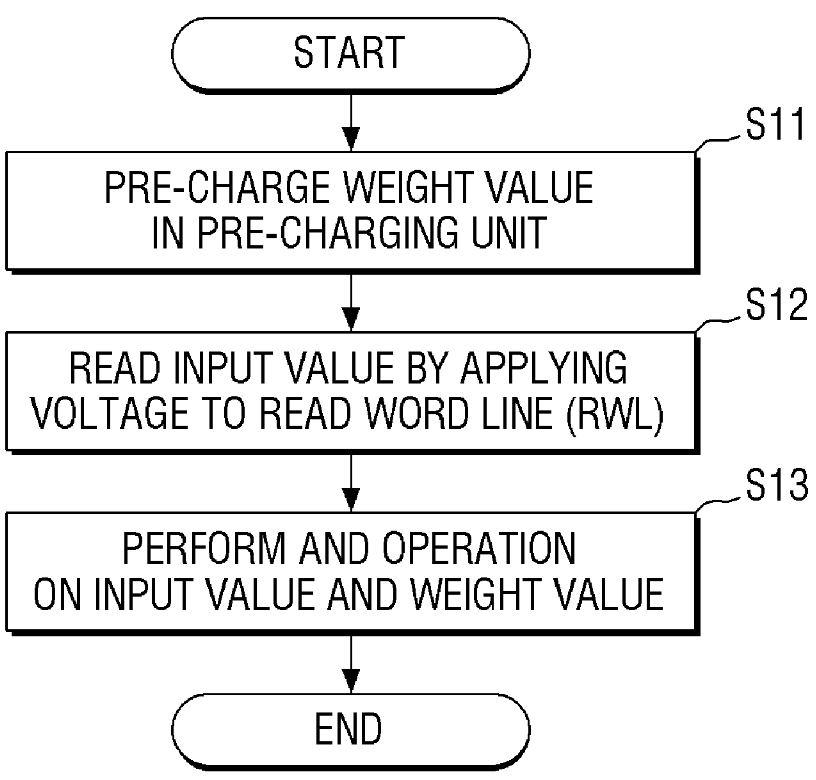
FIG. 14 is a flow chart showing an operation method of a channel-wise accumulation operation in FIG. 13.
Figure 15:
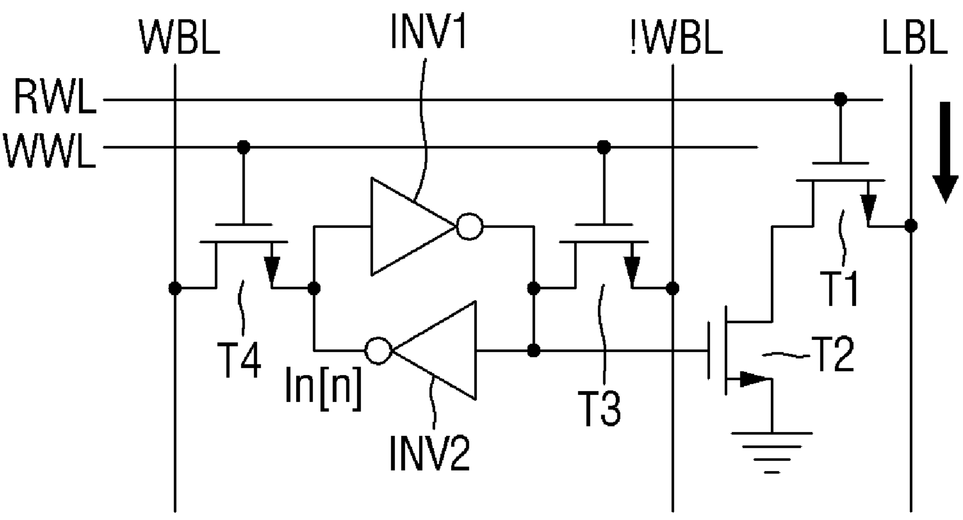
FIG. 15 is a diagram illustrating operation S11 of FIG. 14.
Figure 16:
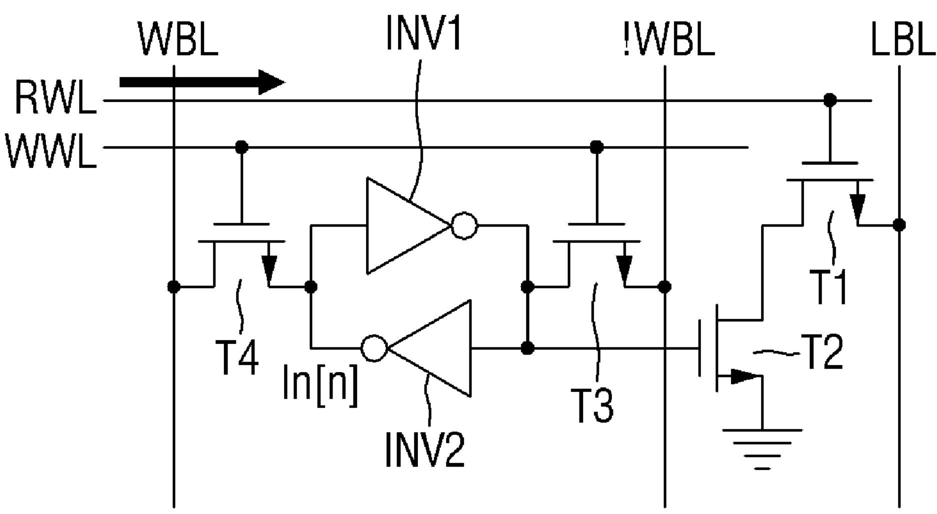
FIG. 16 is a diagram illustrating operation S12 of FIG. 14.
Figure 17:
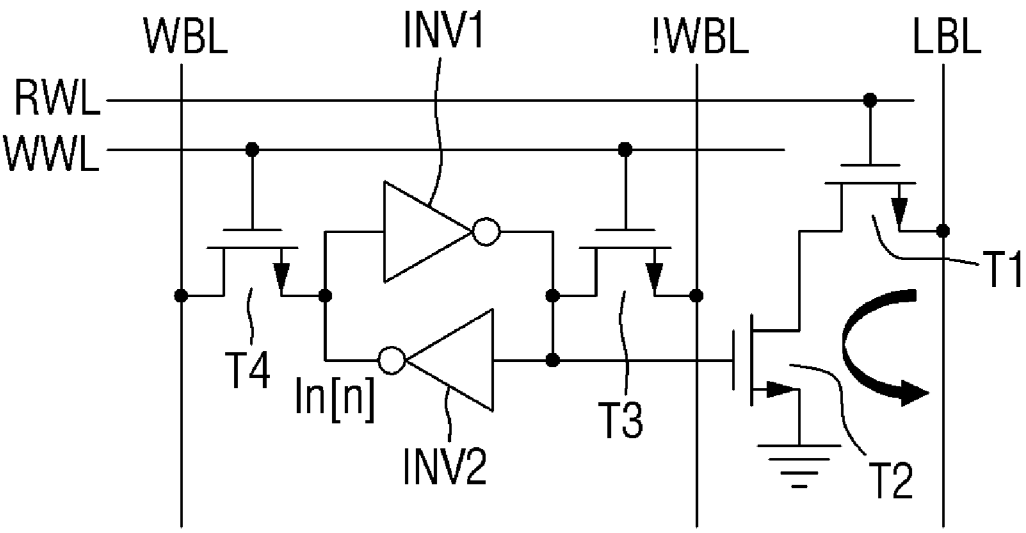
FIG. 17 is a diagram illustrating operation S13 of FIG. 14.

FIG. 14 is a flow chart showing an operation method of a channel-wise accumulation operation in FIG. 13. FIG. 15 is a diagram illustrating operation S11 of FIG. 14. FIG. 16 is a diagram illustrating operation S12 of FIG. 14. FIG. 17 is a diagram illustrating operation S13 of FIG. 14.

Referring to FIG. 14, the weight value is pre-charged (S11).

For example, referring to FIG. 15, the weight value Wn may be pre-charged by applying a voltage to the local bit line LBL.

Next, a voltage is applied to the read word line to read the input value (S12).

For example, referring to FIG. 16, a voltage may be applied to the read word lines RWL and the write word lines WWL of the 8T cells C1 to Cm. The voltage value applied to the read word line RWL and the write word line WWL may be 1V but is not limited thereto.

The gate terminal of the first transistor T1 of the 8T cells C1 to Cm may be connected to the read word line RWL. When a voltage is applied to the read word line RWL, the gate of the first transistor T1 is turned on so as to read the input value Inn. Finally, the AND operation is performed on the input value and the weight value (S13).

For example, referring to FIG. 17, the AND operation may be performed on the weight value Wn read according to the turn-on or turn-off of the first transistor T1 and the input value Inn that is transmitted to and read from the second transistor T2 according to the turn-on or turn-off of the third transistor T3 and the fourth transistor T4. The AND operation on the input value Inn and the weight value Wn may be performed simultaneously with applying a voltage to the read word line RWL to cause the gate of the first transistor T1 to be in the turned-on state to read the input value Inn. For example, the AND operation on the input value Inn and the weight value Wn may be performed simultaneously with reading the input value Inn.

The AND operation may be performed within the 8T cells C1 to Cm. This may be referred to as an in-memory operation.

The AND operation process will be described in detail with reference to FIG. 18.

FIG. 18 is a diagram illustrating an AND operation value of FIG. 17.

Referring to FIG. 18, when the input value Inn is 0 and the weight value Wn is 0, a value output along the local bit line LBL may be 0 when the AND operation is performed.

When the input value Inn is 0 and the weight value Wn is 1, the value output along the local bit line LBL may be 0 when the AND operation is performed.

When the input value Inn is 1 and the weight value Wn is 0, the value output along the local bit line LBL may be 0 when the AND operation is performed.

For example, when the weight value Wn is 0, the value output along the local bit line LBL may be 0 regardless of whether the input value Inn is 0 or 1.

Conversely, when the input value Inn is 1 and the weight value Wn is 1, the value output along the local bit line LBL may be 1 when the AND operation is performed.

For example, when the weight value Wn is 1, the value output along the local bit line LBL may be determined by the input value Inn.

The AND operation result values of each of the 8T cells C1 to Cm may be input to the enable signal input unit En. For example, when the number of 8T cells is 16, the AND operation may be performed within the first 8T cell C1 to the sixteenth 8T cell C16.

The enable signal input unit En may output the AND operation result value to the global bit line GBL in response to the enable signal. For example, the AND operation result values of each of the 8T cells C1 to Cm may be transmitted to the global bit line GBL as one result value or separate result values.

Figure 19:
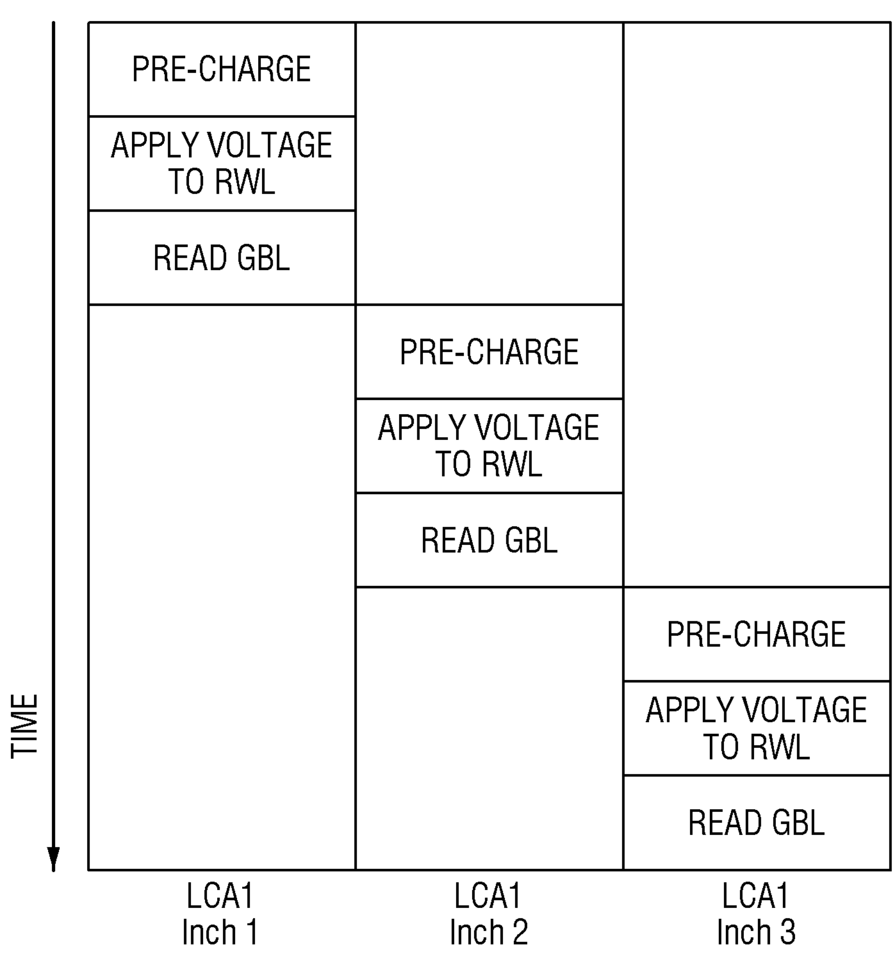
FIG. 19 is a diagram illustrating a method of driving a local cell array different from that of the present embodiment.
Figure 20:
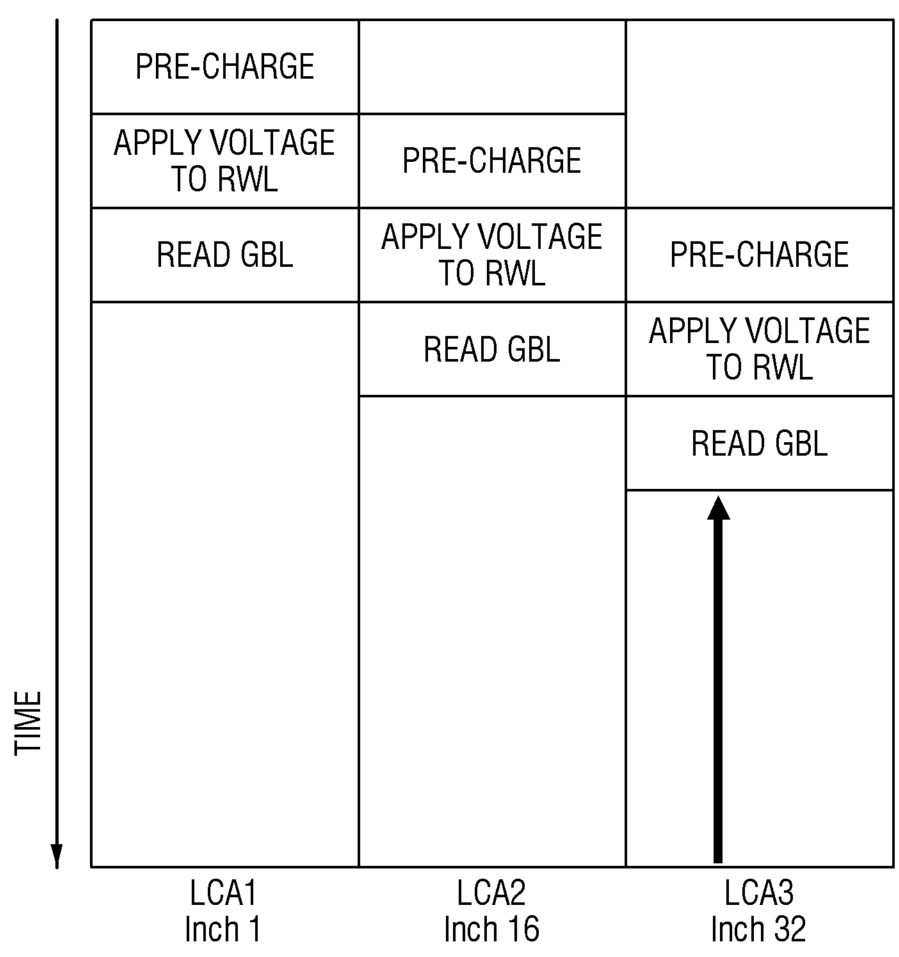
FIG. 20 is a diagram illustrating a method of driving a local cell array according to the present embodiment.

FIG. 19 is a diagram illustrating a method of driving a local cell array different from that of the present embodiment. FIG. 20 is a diagram illustrating a method of driving a local cell array according to the present embodiment.

Referring to FIG. 19, for example, the AND operation on the input value Inn and the weight value Wn may be performed within the 8T cells C1 to Cm simultaneously with pre-charging the weight value Wn in the pre-charging unit PCU of the first local cell array LCA1 of the first input value channel Inch 1, and applying a voltage to the read word lines RWL of the 8T cells C1 to Cm to read the input values Inn stored in the 8T cells C1 to Cm. The AND operation result value may be transmitted to the global bit line GBL.

Thereafter, the AND operation on the input value Inn and the weight value Wn may be performed within the 8T cells C1 to Cm simultaneously with pre-charging the weight value Wn in the pre-charging unit PCU of the first local cell array LCA1 of the second input value channel Inch 2, and applying a voltage to the read word lines RWL of the 8T cells C1 to Cm to read the input values Inn stored in the 8T cells C1 to Cm. The AND operation result value may be transmitted to the global bit line GBL.

Thereafter, the AND operation on the input value Inn and the weight value Wn may be performed within the 8T cells C1 to Cm simultaneously with pre-charging the weight value Wn in the pre-charging unit PCU of the first local cell array LCA1 of the third input value channel Inch 3 different from the first input value channel Inch 1 and the second input value channel Inch 2, and applying a voltage to the read word lines RWL of the 8T cells C1 to Cm to read the input values Inn stored in the 8T cells C1 to Cm. The AND operation result value may be transmitted to the global bit line GBL.

For example, when all the processes of the first input value channel Inch 1 of the first local cell array LCA1 are completed, the process of the second input value channel Inch 2 may be started, and when all the processes of the second input value channel Inch 2 are completed, the process of the third input value channel Inch 3 may be started. There is a disadvantage in that it takes a long time to sequentially accumulate channels in the first local cell array LCA1.

However, referring to FIG. 20, since the operations of different local cell arrays LCA1 to LCAm and different input value channels Inch 1 to Inch n may be simultaneously performed, the operation processing speed may increase.

For example, the AND operation on the input value Inn and the weight value Wn may be performed within the 8T cells C1 to Cm simultaneously with pre-charging the weight value Wn in the pre-charging unit PCU of the first local cell array LCA1 of the first input value channel Inch 1, and applying a voltage to the read word lines RWL of the 8T cells C1 to Cm to read the input values Inn stored in the 8T cells C1 to Cm. The AND operation result value may be transmitted to the global bit line GBL.

The AND operation on the input value Inn and the weight value Wn may be performed within the 8T cells C1 to Cm simultaneously with applying a voltage to the read word lines RWL of the 8T cells C1 to Cm in the first local cell array LCA1 of the first input value channel Inch 1, pre-charging the weight value Wn in the pre-charging unit PCU of the second local cell array LCA2 of the sixteenth input value channel (Inch 16), and applying a voltage to the read word lines RWL of the 8T cells C1 to Cm to read the input values Inn stored in the 8T cells C1 to Cm. The AND operation result value may be transmitted to the global bit line GBL.

The AND operation on the input value Inn and the weight value Wn may be performed within the 8T cells C1 to Cm simultaneously with applying a voltage to the read word lines RWL of the 8T cells C1 to Cm in the second local cell array LCA2 of the sixteenth input value channel Inch 16, pre-charging the weight value Wn in the pre-charging unit PCU of the third local cell array LCA3 of the thirty-second input value channel Inch 32, and applying a voltage to the read word lines RWL of the 8T cells C1 to Cm to read the input values Inn stored in the 8T cells C1 to Cm. The AND operation result value may be transmitted to the global bit line GBL.

Accordingly, the operation processing speed may increase by applying a voltage to the read word lines RWL and the write word lines (WWLs) in the first local cell array LCA1 of the first input value channel Inch 1 and pre-charging the weight value Wn in the second local cell array LCA2 of the second input value channel Inch 2 different from the first input value channel Inch 1.

Figure 21:
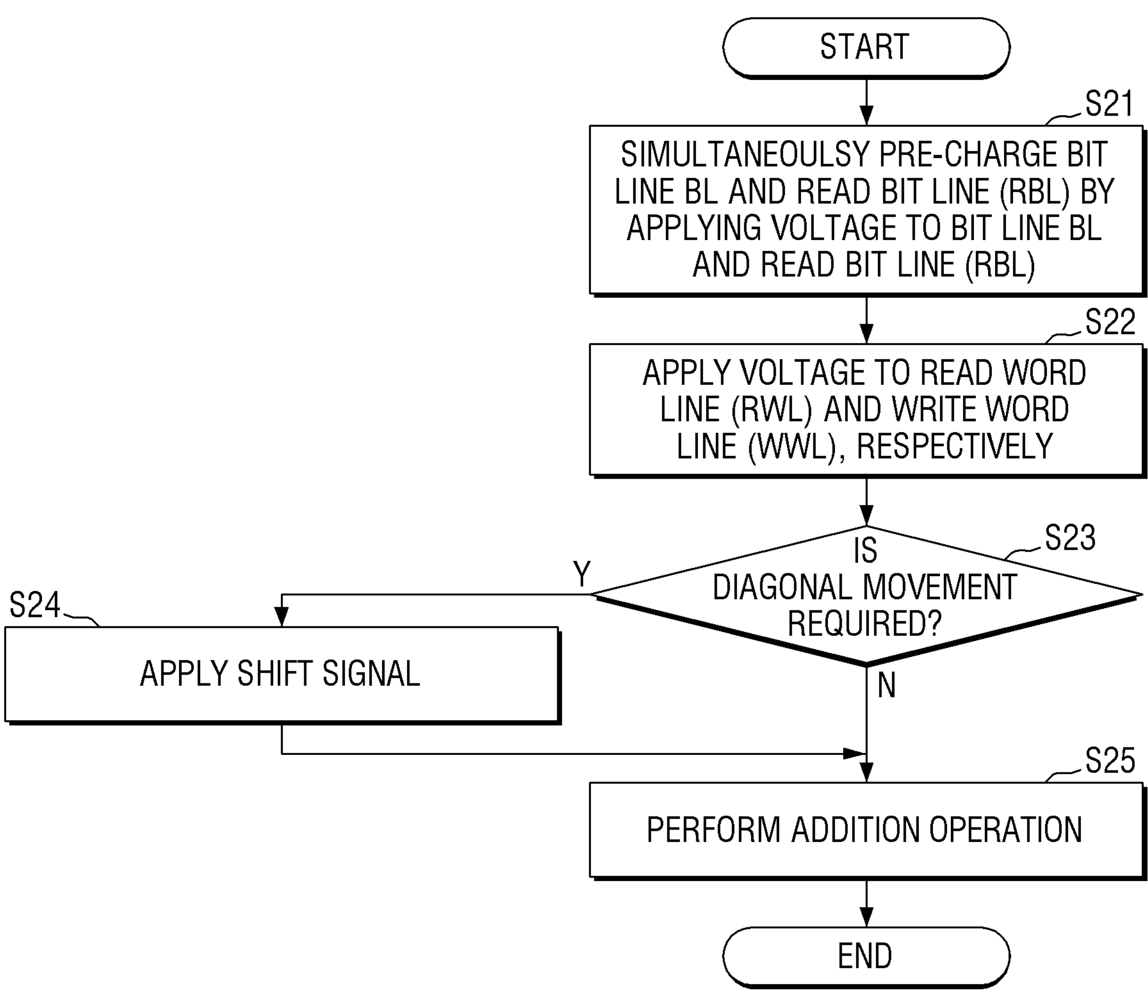
FIG. 21 is a flowchart illustrating an operation method of a bit direction accumulation operation of FIG. 13.
Figure 22:
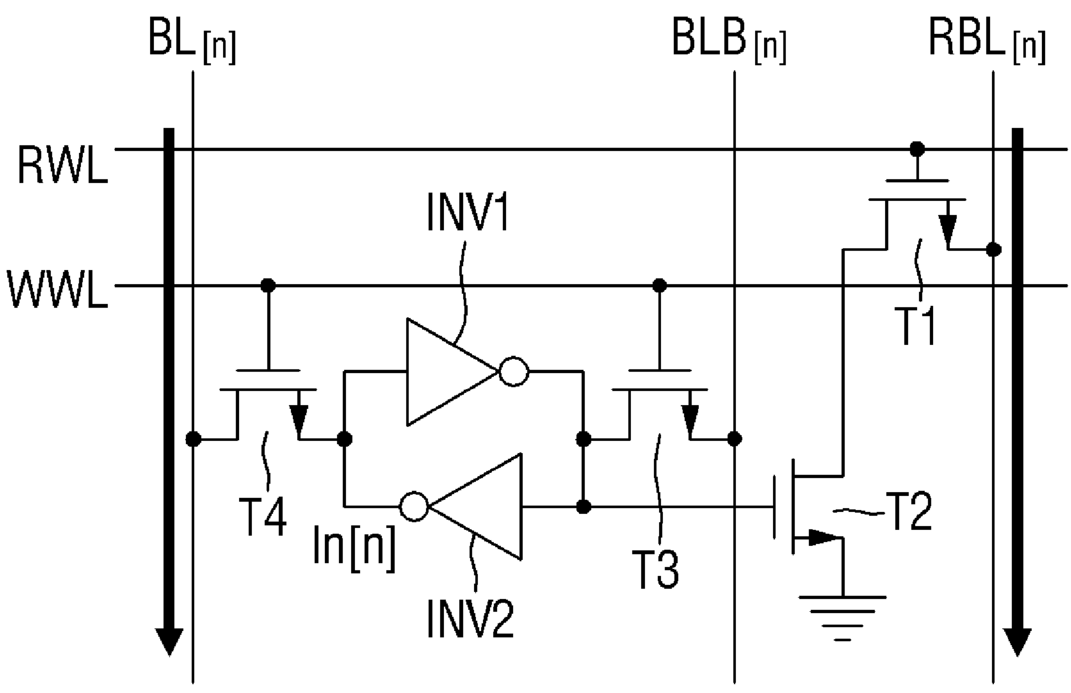
FIG. 22 is a diagram illustrating operation S21 of FIG. 21.
Figure 23:
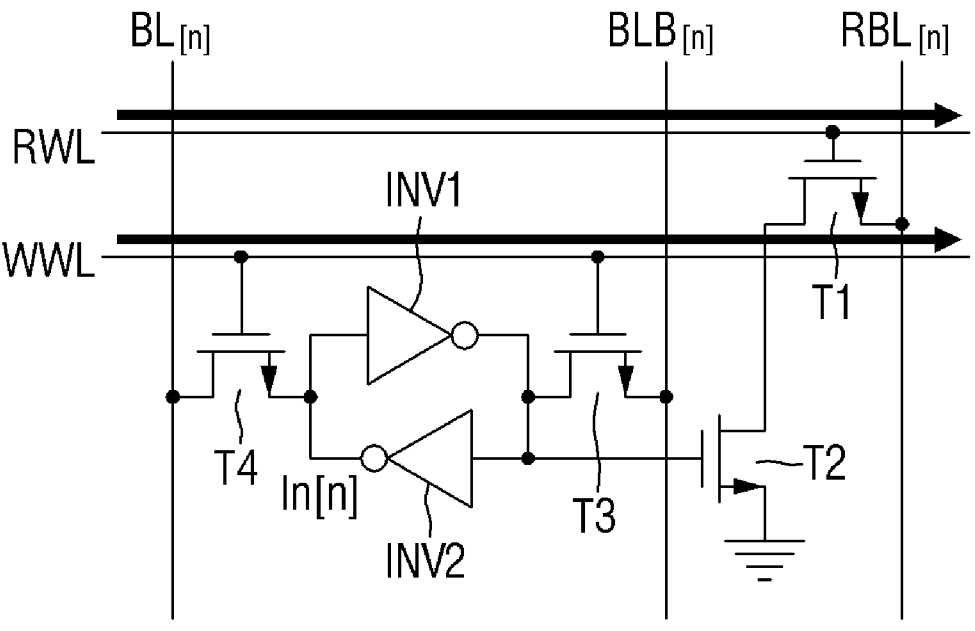
FIG. 23 is a diagram illustrating operation S22 of FIG. 21.
Figure 24:
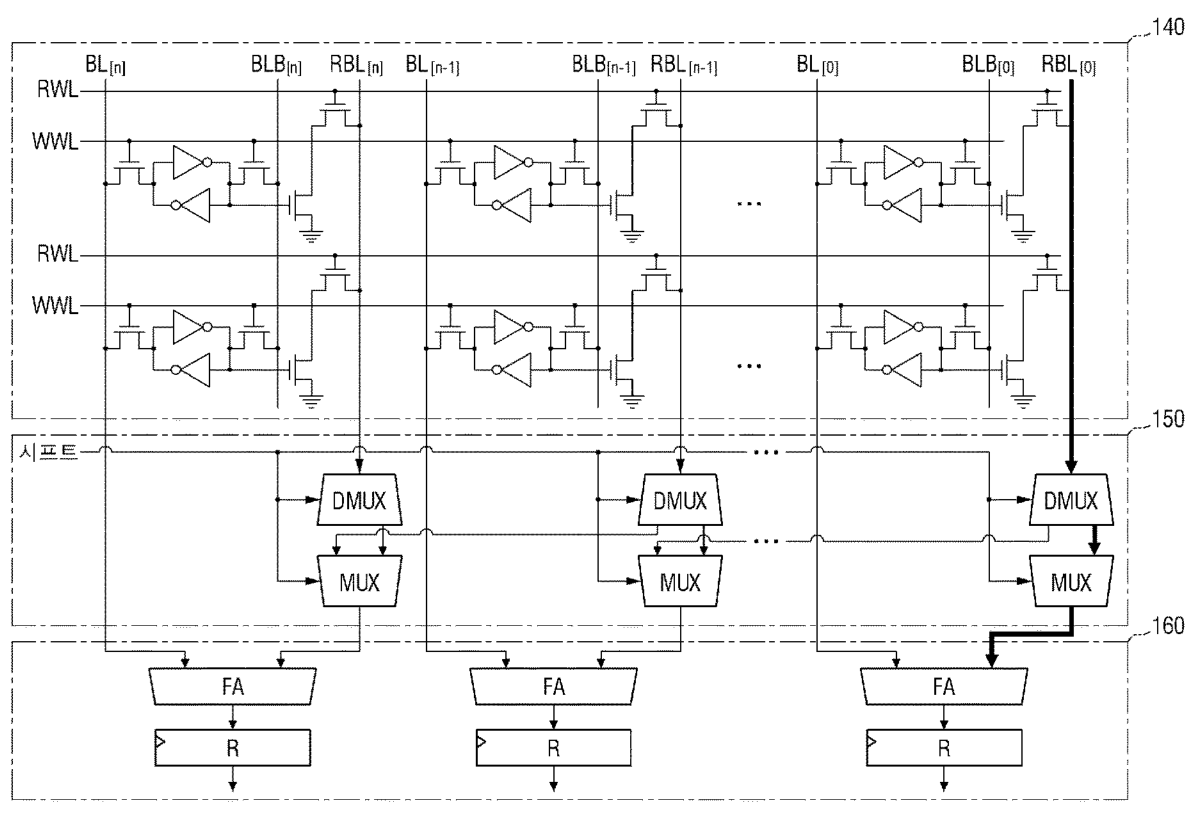
FIG. 24 is a diagram illustrating operation S23 of FIG. 21.
Figure 25:
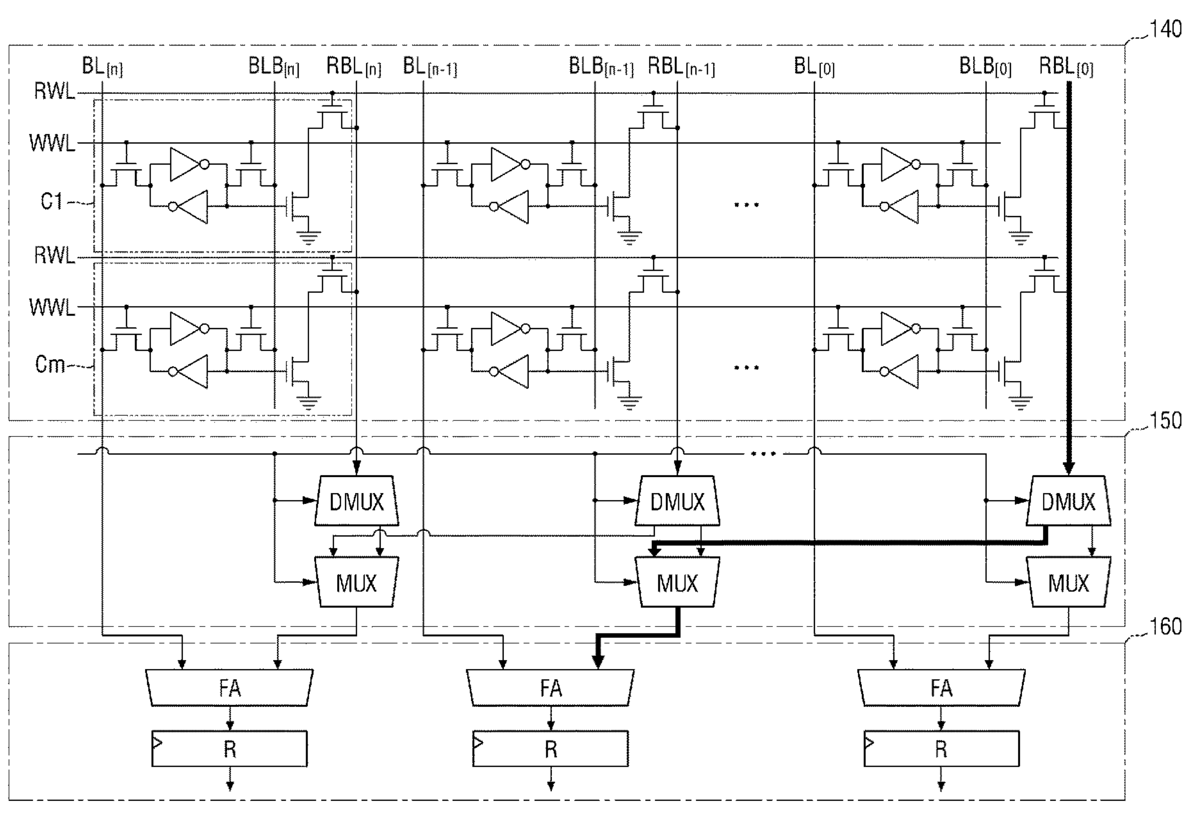
FIG. 25 is a diagram illustrating operation S24 of FIG. 21.

FIG. 21 is a flowchart illustrating an operation method of a bit direction accumulation operation of FIG. 13. FIG. 22 is a diagram illustrating operation S21 of FIG. 21. FIG. 23 is a diagram illustrating operation S22 of FIG. 21. FIG. 24 is a diagram illustrating operation S23 of FIG. 21. FIG. 25 is a diagram illustrating operation S24 of FIG. 21. Referring to FIG. 21, the bit line BL and the read bit line RBL are simultaneously pre-charged (S21).

For example, referring to FIG. 22, a voltage may be applied to the bit line BL and the read bit line RBL to pre-charge the bit line BL and the read bit line RBL.

Next, a voltage may be applied to each of the read word line RWL and the write word line WWL in different data rows (S22).

For example, referring to FIG. 23, a voltage may be applied to the read word line RWL and the write word line WWL. The voltage value applied to the read word line RWL and the write word line WWL may be 1V but is not limited thereto.

Since the gate terminal of the first transistor T1 is connected to the read word line RWL, when a voltage is applied to the read word line RWL, the first transistor T1 may be turned on. Since the gate terminals of the third transistor T3 and the fourth transistor T4 are connected to the write word line WWL, when a voltage is applied to the write word line WWL, the third transistor T3 and the fourth transistor T4 may be turned on.

Next, it may be determined whether a diagonal movement is necessary (S23).

As soon as it is determined that the diagonal movement is not necessary (N in S23), the process moves to the addition array operator to perform the addition operation (S25).

For example, referring to FIG. 24, the output value of the diagonal accumulation SRAM 140 may be input through the demultiplexer DMUX of the diagonal movement logic 150, and then may be directly input to the MUX without being shifted by a single bit. The output value of the multiplexer MUX may be input to the addition array operator 160. The output value of the multiplexer MUX may perform an addition operation in the addition array operator 160.

Conversely, when the diagonal movement is required (Y in S23), a shift signal is applied (S24).

For example, referring to FIG. 25, the shift signal may be received to perform the shift operation. The shift signal may be input to the shift registers SR1 to SRn (illustrated in FIG. 11). The shift registers SR1 to SRn (illustrated in FIG. 8) may receive the shift signal generated by the top controller 170 (illustrated in FIG. 1). In response to the shift signal, the output values of the 8T cells C1 to Cm may be shifted. The shifted output value may perform the bit direction accumulation operation.

For example, when the diagonal movement is required, the output value of the diagonal accumulation SRAM 140 may be input through the demultiplexer DMUX of the diagonal movement logic 150, and then may be shifted by a single bit to be input to the multiplexer MUX. The output value of the multiplexer MUX may be input to the addition array operator 160.

Figure 26:
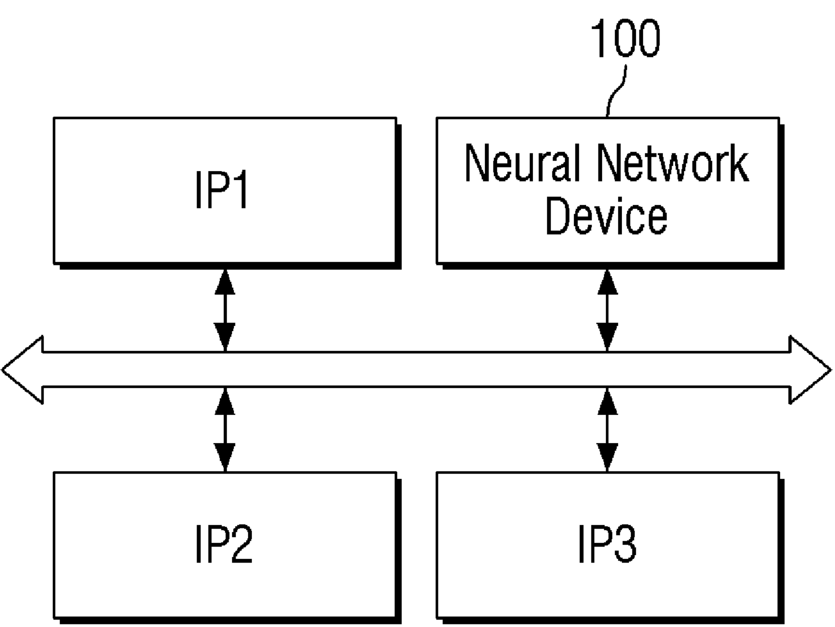
FIG. 26 is a block diagram illustrating an electronic system including a neural network device according to some embodiments.

FIG. 26 is a block diagram illustrating an electronic system including a neural network device according to some embodiments.

Referring to FIG. 26, an electronic system 1000 may extract valid information by analyzing input data in real time based on a neural network, and based on the extracted information, determines a situation or controls components of an electronic device in which the electronic system 1000 is mounted.

For example, the electronic system 1000 may be applied to a drone, an advanced driver assistance system (ADAS), a robot device, a smart TV, a smart phone, a medical device, a mobile device, an image display device, a measurement device, an Internet of Things (IoT) device, and the like, and may be mounted on one of various types of electronic devices.

The electronic system 1000 may include at least one intellectual property (IP) block and the neural network device 100. For example, the electronic system 1000 may include a first IP block IP1, a second IP block IP2, and a third IP block IP3 and the neural network device 100.

The electronic system 1000 may include various types of IP blocks. For example, the IP blocks may include a processing unit, a plurality of cores included in the processing unit, a multi-format codec (MFC), a video module (for example, a camera interface, a Joint Photographic Experts Group (JPEG) processor, a video processor, a mixer, or the like), a 3D graphics core, an audio system, a driver, a display driver, a volatile memory, a non-volatile memory, a memory controller, an input and output interface block, a cache memory, or the like. Each of the first to third IP blocks IP1 to IP3 may include at least one of the various types of IP blocks.

As a technique for connecting IP blocks, there is a connection method based on a system bus. For example, as a standard bus specification, an advanced microcontroller bus architecture (AMBA) protocol of an advanced RISC machine (ARM) may be applied. The bus type of the AMBA protocol may include an advanced high-performance bus (AHB), an advanced peripheral bus (APB), an advanced eXtensible interface (AXI), AXI4, AXI coherency extensions (ACE), and the like. Among the above-described bus types, the AXI is an interface protocol between IPs and may provide a multiple outstanding address function, a data interleaving function, and the like. In addition, other types of protocols, such as uNetwork from Sonics Inc, CoreConnect from IBM, and the open core protocol from OCP-IP, may be applied to the system bus.

The neural network device 100 may generate a neural network, train or learn a neural network, perform an operation based on received input data, perform an information signal based on the execution result, or retrain a neural network. Neural network models may include various types of models such as a convolution neural network (CNN) such as GoogleNet, AlexNet, and VGG Network, a region with convolution neural network (R-CNN), a region proposal network (RPN), a recurrent neural network (RNN), a stacking-based deep neural network (S-DNN), a state-space dynamic neural network (S-SDNN), a deconvolution network, a deep belief network (DBN), a restricted Boltzman machine (RBM), a fully convolutional network, a long short-term memory (LSTM) network, a classification network, a deep Q-network (DQN), and distribution reinforcement learning, but are not limited thereto. The neural network device 100 may include one or more processors for performing operations according to the neural network models. Further, the neural network device 100 may include a separate memory for storing programs corresponding to the neural network models. The neural network device 100 may be variously called a neural network processing device, a neural network integrated circuit, a neural network processing unit (NPU), a deep learning device, or the like.

The neural network device 100 may receive various types of input data from at least one IP block through a system bus, and may generate an information signal based on the input data. For example, the neural network device 100 may generate an information signal by performing a neural network operation on input data, and the neural network operation may include the convolution operation.

The information signal generated by the neural network device 100 may include at least one of various types of recognition signals such as a speech recognition signal, an object recognition signal, an image recognition signal, and a biometric information recognition signal. For example, the neural network device 100 may receive frame data included in a video stream as input data and may generate, from the frame data, a recognition signal for an object included in an image represented by the frame data. However, the present disclosure is not limited thereto, and the neural network device 100 may receive various types of input data and may generate the recognition signal according to the input data.

Figure 27:
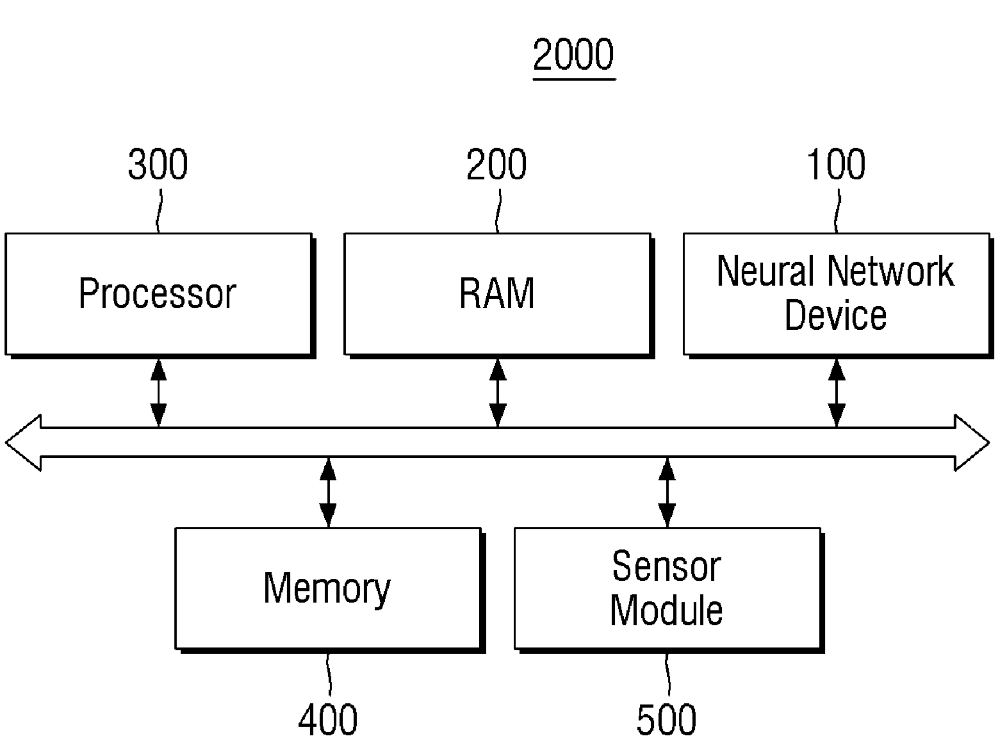
FIG. 27 is a block diagram illustrating another electronic system including a neural network device according to some embodiments.

FIG. 27 is a block diagram illustrating another electronic system including a neural network device according to some embodiments.

A description of an electronic system 2000 of FIG. 27 that is redundant with that of FIG. 26 will be omitted.

Referring to FIG. 27, the electronic system 2000 may include a neural network device 100, a random access memory (RAM) 200, a processor 300, a memory 400, and a sensor module 500. The neural network device 100 may have components corresponding to the neural network device 100 of FIG. 1.

The RAM 200 may temporarily store programs, data, or instructions. For example, the programs and/or data stored in the memory 400 may be temporarily loaded into the RAM 200 according to the control of the processor 300 or a booting code. The RAM 200 may be implemented using a memory such as a dynamic RAM (DRAM) or an SRAM.

The processor 300 may control the overall operation of the electronic system 1000, and as an example, the processor 300 may be a central processing unit (CPU). The processor 300 may include one processor core (single core) or may include a plurality of processor cores (multi-core). The processor 300 may process or execute programs and/or data stored in the RAM 200 and the memory 400. For example, the processor 300 may control functions of the electronic system 1000 by executing programs stored in the memory 400.

The memory 400 is a storage location for storing data and may store, for example, an operating system (OS), various programs, and various types of data. The memory 400 may be a DRAM but is not limited thereto. The memory 400 may include at least one of a volatile memory and a non-volatile memory. The non-volatile memory may include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. The volatile memory may include a DRAM, an SRAM, a synchronous DRAM (SDRAM), a phase-change RAM (PRAM), a magnetic RAM (MRAM), a resistive RAM (RRAM), a ferroelectric RAM (FeRAM), and the like. In addition, in one embodiment, the memory 400 is at least one of a hard disk drive (HDD), a solid state drive (SSD), a compact flash (CF), a secure digital (SD), a Micro-secure digital (Micro-SD), a mini-secure digital (Mini-SD), extreme digital (xD), or a memory stick. It may include at least one of (Mini Secure Digital), xD (extreme digital), or a memory stick.

The sensor module 500 may collect information around the electronic system 1000. The sensor module 500 may detect or receive an image signal from the outside of the electronic system 1000 and may convert the detected or received image signal into image data, for example, an image frame. To this end, the sensor module 500 may include at least one of various types of sensing devices, such as, for example, an imaging device, an image sensor, a light detection and ranging (LIDAR) sensor, an ultrasonic sensor, and an infrared sensor, or receive sensing signals from the sensing devices. The sensor module 500 may provide an image frame to the neural network device 100. For example, the sensor module 500 may include an image sensor, photograph an external environment of the electronic system 2000 to generate a video stream, and sequentially provide consecutive image frames of the video stream to the neural network device 100.

Although the embodiments of the present disclosure have been described with reference to the accompanying drawings, the present disclosure is not limited to the above embodiments and may be manufactured in various different forms such as processing multiple weights simultaneously, and the like, by including multiple convolution SRAMs and diagonal accumulation SRAMs, and those with ordinary knowledge in the technical field to which the present disclosure belongs will be able to understand that the present disclosure can be implemented in other specific forms without changing the technical idea or essential features of the present disclosure.

In concluding the detailed description, those skilled in the art will appreciate that many variations and modifications may be made to the preferred embodiments without substantially departing from the principles of the present disclosure. Therefore, the disclosed preferred embodiments of the disclosure are used in a generic and descriptive sense only and not for purposes of limitation.

What is claimed is:

1. A neural network device comprising:

a convolution static random access memory (SRAM) configured to output a first operation value by performing an accumulation peripheral operation on a first input value channel and a first weight channel and output a second operation value by performing the accumulation peripheral operation on a second input value channel sequentially following the first input value channel and a second weight channel sequentially following the first weight channel;

an accumulation peripheral operator connected to the convolution SRAM, and configured to receive the first operation value and the second operation value of the convolution SRAM to perform the accumulation peripheral operation on the first operation value and the second operation value;

a multiplexer array configured to select and output an output value according to a selection signal;

a diagonal accumulation SRAM configured to perform a bitwise accumulation of variable weight values and a spatial-wise accumulation operation on an input;

a diagonal movement logic configured to receive the output of the diagonal accumulation SRAM and perform a shift operation according to a shift signal; and an addition array operator configured to perform an addition operation of the output values of the diagonal movement logic subsequent to the shift operation, wherein the multiplexer array selects any one of an output value of the accumulation peripheral operator and an output value of the addition array operator according to the selection signal and outputs the selected output value to the diagonal accumulation SRAM.

2. The neural network device of claim 1, further comprising a top controller configured to receive the output value of the addition array operator, wherein the top controller generates the shift signal based on the output value of the addition array operator.

3. The neural network device of claim 1, wherein the convolution SRAM includes n (n is a natural number) columns, and the columns include m (m is a natural number) local cell arrays.

4. The neural network device of claim 3, wherein each of the local cell arrays includes a pre-charging unit connected to a local bit line, m 8T cells connected to the local bit line, and an enable signal input unit connected to the local bit line and configured to output an output value to a global bit line in response to an enable signal.

5. The neural network device of claim 4, wherein n weight channels are input to the convolution SRAM, and weight values, which are not zero, among weight values of the n weight channels are loaded into the local cell arrays.

6. The neural network device of claim 5, wherein the pre-charging unit charges weight values of the n weight channels in a channel direction through the local bit line.

7. The neural network device of claim 4, wherein each 8T cell of the m 8T cells, includes a first transistor, a second transistor, a third transistor, and a fourth transistor and first and second inverters, a gate terminal of the first transistor is connected to a read word line, gate terminals of the third and fourth transistors are connected to a write word line, and an input value stored in the 8T cell is read by applying a voltage to the read word line.

8. The neural network device of claim 7, wherein the input value stored in the 8T cell is subjected to an AND operation with weight values of the pre-charging unit.

9. The neural network device of claim 8, wherein the enable signal input unit transmits an AND operation result of the input value stored in the 8T cell and the weight values of the pre-charging unit to the global bit line in response to the enable signal.

10. The neural network device of claim 1, wherein the convolution SRAM further outputs a third operation value by performing the accumulation peripheral operation on a third input value channel sequentially following the second input value channel and a third weight channel sequentially following the second weight channel, and the accumulation peripheral operator further performs the accumulation peripheral operation on the first operation value and the third operation value and the accumulation peripheral operation on the second operation value and the third operation value.

11. The neural network device of claim 1, wherein the diagonal accumulation SRAM includes an 8T cell, the 8T cell includes a first transistor, a second transistor, a third transistor, and a fourth transistor and first and second inverters, a gate terminal of the first transistor is connected to a read word line, and gate terminals of the third and fourth transistors are connected to a write word line.

12. The neural network device of claim 11, wherein the 8T cell includes a read bit line and a write bit line, the read bit line and the write bit line are pre-charged by simultaneously applying a voltage thereto, and a read operation of an input value stored in the 8T cell is performed by simultaneously applying a voltage to the read word line and the write word line.

13. The neural network device of claim 1, wherein the diagonal movement logic includes a demultiplexer (DMUX) and a multiplexer (MUX), the demultiplexer receives the shift signal and shifts an output value of the diagonal accumulation SRAM, and the multiplexer receives the output value generated from the demultiplexer and transmits the received output value to the addition array operator.

14. The neural network device of claim 1, wherein the addition array operator includes a full adder and a register.

15. A convolution static random access memory (SRAM) comprising:

a pre-charging unit;

a plurality of 8T SRAM cells each connected to a bit line to form a channel; and an enable signal input, wherein the pre-charging unit charges weight values in a direction along the channel through the bit line, an input value stored in at least one of the 8T SRAM cells and a weight value output along the bit line are combined in an AND operation performed within the at least one of the 8T SRAM cells, and there is a variation of the weight values along the channel.

16. The convolution SRAM of claim 15, wherein each of the 8T SRAM cells includes a first transistor, a second transistor, a third transistor, and a fourth transistor and first and second inverters, a gate terminal of the first transistor is connected to a read word line, gate terminals of the third and fourth transistors are connected to a write word line, and the input value stored in the at least one of the 8T SRAM cells is read by applying a voltage to the read word line.

17. The convolution SRAM of claim 15, wherein one end of each of the pre-charging unit and the 8T SRAM cells is connected to a local bit line, and an output value of the local bit line is transmitted to a global bit line according to the enable signal input.

18. A neural network device comprising:

a diagonal accumulation static random access memory (SRAM); and a diagonal movement logic, wherein the diagonal accumulation SRAM includes a first transistor, a second transistor, a third transistor, and a fourth transistor and first and second inverters, a gate terminal of the first transistor is connected to a read word line, a gate terminal of the second transistor is connected to any one of the first and second inverters, gate terminals of the third and fourth transistors are connected to a write word line, the first and second inverters store a first input value by applying a voltage to the write word line, the first and second transistors perform an AND operation on a second input value and the first input value supplied through a read bit line by applying a voltage to the read word line, and wherein the diagonal movement logic is configured to shift an output value of the diagonal accumulation SRAM by a single bit based on a shift signal.

19. The neural network device of claim 18, wherein the diagonal accumulation SRAM further includes a shift register for performing a shift operation on the first input value and the second input value.

20. The neural network device of claim 18, further comprising:

an addition array operator configured to perform an addition operation of the output values of the diagonal movement logic subsequent to the shift operation, wherein the diagonal movement logic includes a demultiplexer (DMUX) and a multiplexer (MUX), the demultiplexer receives the shift signal and shifts an output value of the diagonal accumulation SRAM, and the multiplexer receives the output value generated from the demultiplexer and transmits the received output value to the addition array operator.

* * * * *